United States Patent
Eitan

(10) Patent No.: US 6,704,217 B2
(45) Date of Patent: Mar. 9, 2004

(54) SYMMETRIC SEGMENTED MEMORY ARRAY ARCHITECTURE

(75) Inventor: Boaz Eitan, Ra'anana (IL)

(73) Assignee: Saifun Semiconductors Ltd., Netanya (IL)

(*) Notice: Subject to any disclaimer, the term of this patent is extended or adjusted under 35 U.S.C. 154(b) by 0 days.

(21) Appl. No.: 10/059,075

(22) Filed: Jan. 30, 2002

(65) Prior Publication Data

US 2002/0196698 A1 Dec. 26, 2002

Related U.S. Application Data

(63) Continuation of application No. 09/727,781, filed on Dec. 4, 2000, which is a continuation-in-part of application No. 09/536,125, filed on Mar. 28, 2000, which is a continuation-in-part of application No. 09/348,720, filed on Jul. 6, 1999, now Pat. No. 6,285,574, which is a continuation-in-part of application No. 08/989,690, filed on Dec. 12, 1997, now Pat. No. 5,963,465.

(51) Int. Cl.⁷ .............................................. G11C 5/06
(52) U.S. Cl. ....................... 365/63; 365/51; 365/230.04
(58) Field of Search ............................... 365/230.04, 51, 365/63, 185.11, 185.16, 185.33

(56) References Cited

U.S. PATENT DOCUMENTS 5,590,068 A * 12/1996 Bergemont ................... 365/63
6,351,415 B1 * 2/2002 Kushnarenko ......... 365/185.18

* cited by examiner

Primary Examiner—Richard Elms
Assistant Examiner—Hien Nguyen
(74) Attorney, Agent, or Firm—Eitan, Pearl, Latzer & Cohen-Zedek, LLP

(57) ABSTRACT

A virtual ground array includes memory elements, select transistors, select lines connected with the select transistors, word lines, global bit lines and local bit lines connecting the select transistors with the memory elements, wherein each of the memory elements has a source and a drain, the virtual ground array is operative to select a set of memory elements and to fix the drains of the set of memory elements to a predetermined potential, the word lines and at least two of the select transistors select the set of memory elements and the global bit lines connect the select transistors to source and drain power supplies.

4 Claims, 17 Drawing Sheets

SYMMETRIC SEGMENTED MEMORY ARRAY ARCHITECTURE

CROSS-REFERENCE TO RELATED APPLICATIONS

This application is a continuation application of U.S. Ser. No. 09/727,781, filed Dec. 4, 2000, which is a continuation-in-part application of U.S. Ser. No. 09/536,125, filed Mar. 28, 2000, which is a continuation-in-part of U.S. patent application Ser. No. 09/348,720, filed Jul. 6, 1999, now U.S. Pat. No. 6,285,574, which is a continuation-in-part application of U.S. patent application Ser. No. 08/989,690, filed Dec. 12, 1997 now U.S. Pat. No. 5,963,465, all of which are incorporated in their entirety by reference herein.

FIELD OF THE INVENTION

The present invention relates to memory array architectures generally and to symmetric memory array architectures in particular.

BACKGROUND OF THE INVENTION

Memory arrays are well known in the art and comprise matrices of memory cells organized into rows and columns. Each memory cell comprises a source, a drain and a gate, each of which has to receive voltage in order for the cell to be accessed. Columns of sources and columns of drain are connected together by bit lines while rows of gates are connected together by word lines. To activate a cell, one drain bit line, one source bit line and one word line must receive voltage.

A standard memory array architecture consists of one metal line on each column, periodically connected to the underlying bit line via a contact. The contact typically is large and is present within the memory array area. The word line is typically of lower resistance and its contact is located outside of the memory array area. There is typically a common source line for a plurality of memory cells. Furthermore, the metal lines are themselves quite thick. Typically, the distance between bit lines is defined by the width of either or both of the metal lines and the contacts, where the contacts are typically wider than the metal lines.

Various memory array architectures are known which reduce the size of the memory array area by reducing the number of contacts and/or metal lines. In virtual ground architectures, the common ground line is eliminated. Instead, the drain of one cell serves as the source for its neighboring cell. Bit lines are continuous diffusions with a contact to the metal lines every X (8, 16, 24, 32, 64, 128, etc.) cells to reduce resistance. The gain in area is up to 40% due to the reduced number of contacts and the elimination of the common source line.

To further reduce array size, the alternate metal, virtual ground architecture (AMG), described in U.S. Pat. No. 5,204,835, has two bit lines per metal line. Typically, in the AMG architecture, the cell size is close or equal to the minimum feature size possible for the cells.

Standard virtual ground architectures access every cell symmetrically (i.e. every bit line receives voltage directly from a metal line). The AMG architecture, which is more compact than standard virtual ground architectures, directly provides voltage to the metalized bit lines but indirectly provides voltage to the segmented, non-metalized bit lines. As a result, the voltage on an activated non-metalized bit line (which is provided through n-channel select transistors) is lower than the voltage on a simultaneously activated metalized bit line. Furthermore, n-channel transistors are not good at passing the high voltages needed for programming.

The non-symmetry of the AMG architecture makes it difficult to use with a nitride read only memory (NROM) array which stores two bits in each NROM cell. Such a cell is described in Applicant's copending U.S. application Ser. No. 08/905,286, filed Aug. 1, 1997 entitled "Two Bit Non-Volatile Electrically Erasable and Programmable Semiconductor Memory Cell Utilizing Asymmetrical Charge Trapping" and assigned to Saifun Semiconductors, the same assignee as for this application, whose disclosure is incorporated herein by reference. The two bits in a cell are located of each side of the cell and each bit is accessed by voltages on the two neighboring bit lines of the cell. Accordingly, the cell requires that its two neighboring bit lines receive equivalent amounts of voltage thereby to read both bits equally (although not simultaneously).

Some architectures segment the bit lines. Each row of segmented bit lines is called a "block" and each block typically includes block select transistors to activate only one block at a time. This is particularly important for FLASH electrically erasable, programmable, read only memory (FLASH EEPROM) arrays which pass high voltages along the bit lines during programming and erase operations. During programmming, the bit line voltages disturb the unselected cells.

To reduce the total time the programming voltage disturbs the cells, the bit lines are segmented into small blocks.

SUMMARY OF THE INVENTION

An object of the present invention is to provide a symmetric architecture for memory cells.

In one embodiment, the memory array includes a plurality of diffusion bit lines, a plurality of select transistors and even and odd types of metal bit lines. There is one select transistor per diffusion bit line, the select transistors being of first, second, third, fourth, fifth, sixth, seventh and eighth types. The odd metal bit lines are connectable to the first, third, fifth and seventh select transistor types and the even metal bit lines are connectable to the second, fourth, sixth and eighth select transistor types.

Moreover, in accordance with a preferred embodiment of the present invention, the division bit lines have first and second ends and wherein the second, fourth, sixth and eighth types of select transistors are connected at the second ends of their associated diffusion bit lines and the first, third, fifth and seventh types of select transistors are connected to the first ends of their associated diffusion bit lines.

Further, in accordance with a preferred embodiment of the present invention, the array also includes even and odd contact bit lines, connectable to the even and odd types of metal bid lines, respectively, wherein the second, fourth, sixth and eighth types of select transistors are connected to the even contact bit lines and the first, third, fifth and seventh types of select transistors are connected to the odd contact bit lines.

Still further, in accordance with a preferred embodiment of the present invention, the memory array includes pairs of segmenting select transistors adapted to access a segment of eight diffusion bit lines, wherein a first segmenting select transistor of a segment is connected between select transistors of a segment and a first metal bit line and a second segmenting select transistor of the segment is connected between the select transistors of the segment and a neighboring metal bit line to the first metal bit line.

In accordance with a preferred embodiment of the present invention, the memory array includes nitride read only memory (NROM) cells.

In accordance with a further preferred embodiment of the present invention, the select transistors may be low threshold voltage devices. Alternatively, they may have a channel length shorter than a standard channel length of a process.

There is also provided, in accordance with a preferred embodiment of the present invention, a memory array which includes a first plurality of metal bit lines, a second plurality of diffusion bit lines and a third plurality of select transistors, wherein there are more than two diffusion bit lines per metal bit line.

Further, in accordance with a preferred embodiment of the present invention, there are more select transistors than diffusion bit lines.

Still further, in accordance with a preferred embodiment of the present invention, there can be four or eight diffusion bit lines per metal bit line.

In an alternative embodiment the second plurality is not a multiple of two. It can be an odd plurality.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

Figure 1:
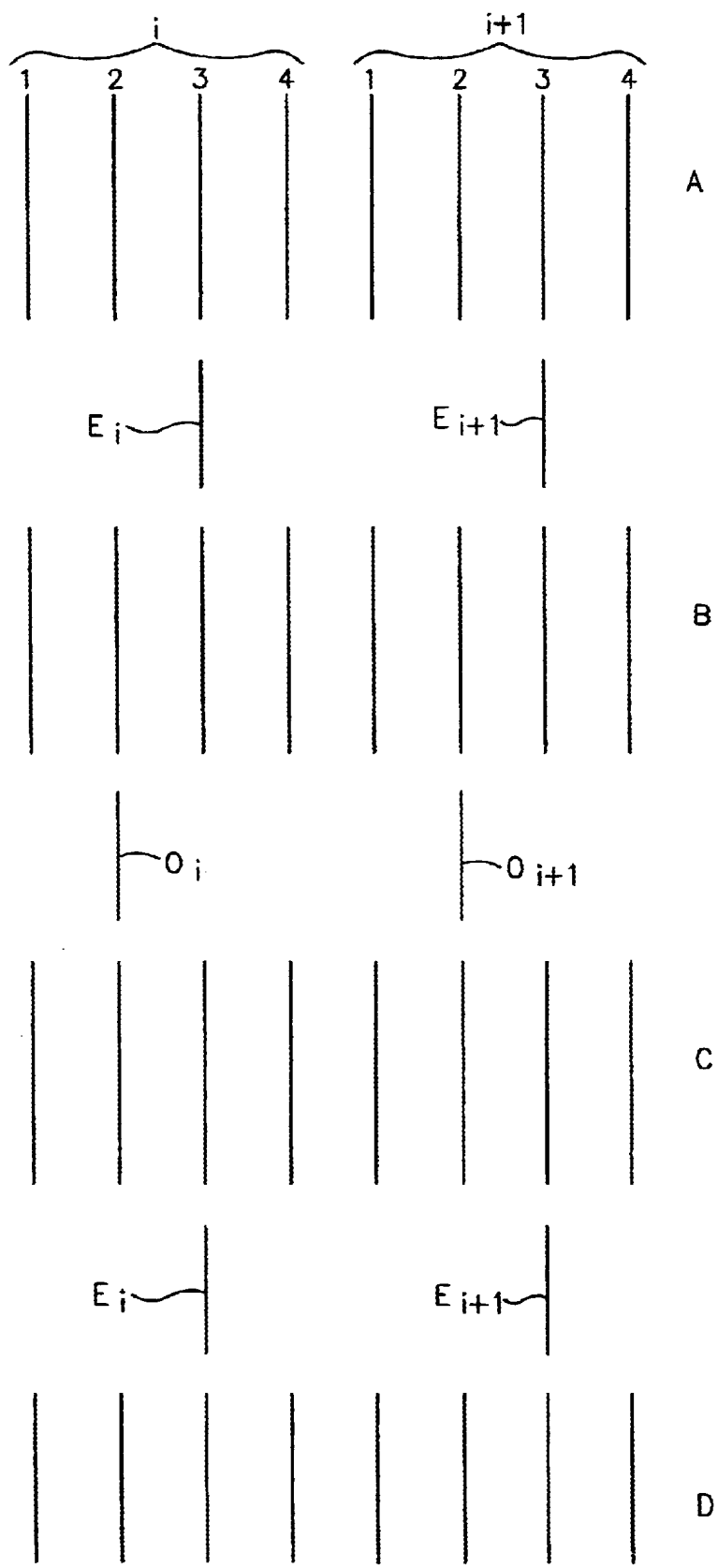
FIG. 1 is a schematic illustration of an arrangement of bit lines in a memory array, in accordance with a preferred embodiment of the present invention.

Reference is now made to FIG. 1, which schematically illustrates the arrangement of bit lines within the memory array of the present invention.

The memory array is divided into alternating cell areas and select areas, where the cell areas have cell bit lines and the select areas have contact bit lines. Four cell areas are shown, labeled A, B, C and D. A typical memory area will have many more cell areas than shown.

The cell bit lines are organized into groups, each group having four columns. Two groups i and i+1 are shown, each group having column labeled 1, 2, 3, and 4. The contact bit lines come in two flavors, even and odd (labeled E and O, respectively) and are found in alternate select areas. Every group of cell bit lines is associated with one even and one odd contact bit line. Thus, FIG. 1 shows even select areas between cell areas A and B and between cell areas C and D. Both even select areas have two even contact bit lines $E_i$ and $E_{i+1}$. FIG. 1 shows an odd select area between cell areas B and C which has two odd contact bit lines $O_i$ and $O_{i+1}$.

As can be seen, there is one contact bit line per group of four cell bit lines per select area and there are two types of select areas. FIG. 1 shows that the even contact bit lines E are associated with column 3 of each group while the odd contact bit lines are associated with column 2 of each group. As will be shown in the layouts of FIGS. 4 and 5, the contact bit lines are not necessarily formed within column 2 or 3 but rather within a four column portion of the select area.

Figure 2:
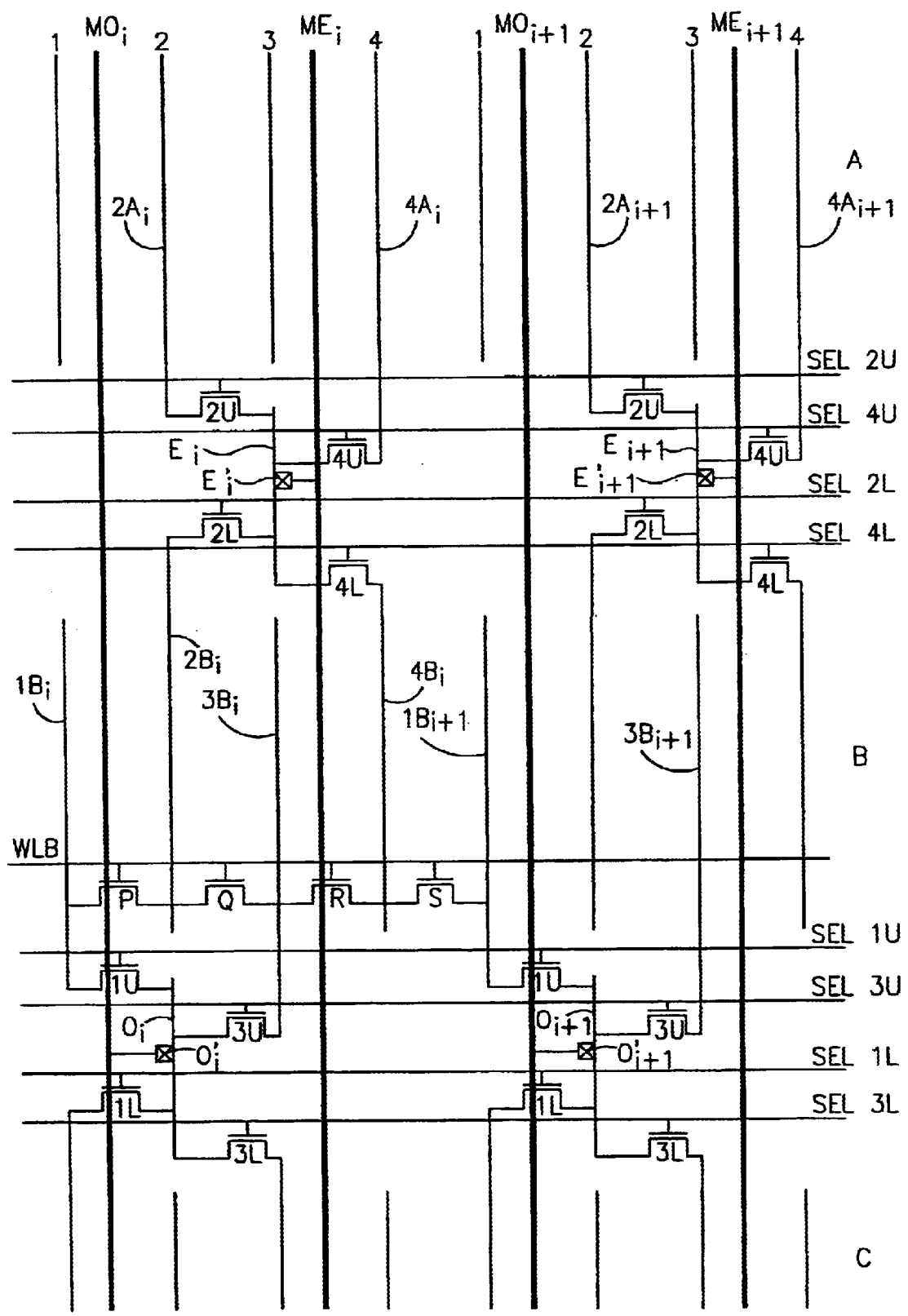
FIG. 2 is a schematic illustration of an exemplary arrangement of metal lines over the bit lines of FIG. 1 in accordance with the present invention.

As shown in FIG. 2 to which reference is now made, one contact is formed on each contact bit line and is labeled with an apostrophe ('). For example, the contacts of contact bit lines $E_i$ are labeled $E_i'$. Since there is only one contact bit line per four cell bit lines, the contact can be as large as necessary without generally affecting the distance between cell bit lines.

There are two metal lines MO and ME per group of cell bit lines, where even metal lines ME connect together the even contacts of the group and odd metal lines MO connect together the odd contacts of the group.

There are four select transistors connected to each contact bit line O or E and each type of select transistor is controlled by its own select line SEL. Each select transistor connects its contact bit line to one nearby cell bit line. Thus two of the four select transistors connect to two of the cell bit lines in the group of cell bit lines above the contact bit line. Similarly, the remaining two of the four select transistors connect to two of the four cell bit lines in the group below.

In accordance with a preferred embodiment of the present invention, the select transistors associated with each odd contact bit line O connect only to odd columns and the select transistors associated with each even contact bit line E connect only to even columns. Thus, the four select transistors 2U, 4U, 2L, 4L of each contact bit line E connect to columns 2 and 4 of the upper group of bit lines and to columns 2 and 4 of the lower group of bit lines, respectively. These four select transistors are activated by select lines SEL 2U, SEL 4U, SEL 2L and SEL 4L, respectively. Similarly, the four select transistors 1U, 3U, 1L, 3L of contact bit line O connect to columns 1 and 3 of the upper group of bit lines and columns 1 and 3 of the lower group of bit lines, respectively. They are activated by select lines SEL 1U, SEL 3U, SEL 1L and SEL 3L, respectively.

It will be appreciated that all four columns of bit lines receive power even though there are only two contact bit lines per group of four cell bit lines. It will further be appreciated that each cell bit line is accessed by only one select transistor.

FIG. 2 indicates that memory cells are located between neighboring cell bit lines, a row of which is accessed with a single word line WL, For clarity, only cells P, Q, R, and S are shown with their word line WLB. The memory cells can be any type of memory cell, such as ROM, EPROM, EEPROM and FLASH EEPROM cells, for example.

The present architecture is particularly suited to memory cells that prefer symmetric accessing. For example, the NROM cell, described in Applicant's copending U.S. application Ser. No. 08/902,890 filed Jul. 30, 1997, entitled "Non-Volatile Electrically Erasable And Programmable Semiconductor Memory Cell Utilizing Asymmetrical Charge Trapping" and assigned to Saifun Semiconductors, the same assignee as this application, which is incorporated herein by reference, is read in one direction and programmed in the other direction. This cell requires a symmetric architecture such as is shown herein in FIG. 2. Furthermore, the dual bit NROM cell, described in Applicant's copending U.S. application Ser. No. 08/905,286 filed Aug. 1, 1997, entitled "Two-Bit Non-Volatile Electrically Erasable And Programmable Semiconductor Memory Cell Utilizing Asymmetrical Charge Trapping" and assigned to Saifun Semiconductors, the same assignee as this application which is incorporated herein by reference and shown herein below with respect to FIG. 3, requires a symmetric architecture to read both bits of the cell. The following discussion will assume a singe bit cell unless specifically mentioned otherwise.

As will be described herein in more detail, each memory cell is accessed by one select transistor "above" it and one select transistor "below" it, thereby ensuring that the current path from the two active contacts is equal for every memory cell and thus, the resistance associated with the current path to each memory cell is generally equal.

The four exemplary cells in row B are labeled P, Q, R and S, where cell P is between cell bit lines $1B_i$ and $2B_i$, cell Q is between cell bit lines $2B_i$ and $3B_i$, cell R is between cell bit lines $3B_i$ and $4B_i$ and cell S is between cell bit lines $4B_i$ ad $1B_{i+1}$. An exemplary current path Rough cell Q moves either from cell bit line $2B_i$ to cell bit line $3B_i$ or in the reverse direction. In either case, cell bit lines $2B_i$ and $3B_i$ must receive power from their respective metal lines $ME_i$ and $MO_i$. Even metal line $ME_i$ provides a first voltage to even contact $E_i'$ which is connected to even cell bit line $2B_i$, via select transistor 2L. Thus, select line SEL 2L must be activated. Odd metal line $MO_i$ provides power to odd contact $O_i'$ which is connected to odd cell bit line $3B_i$ via select transistor 3U. Thus, select line SEL 3U must be activated.

It is noted that two select transistors are required to provide current to cell Q, one of which is an "upper" select transistor and one of which is a "lower" select transistor. This is true for every memory cell in the array. The two neighboring bit lines for a given cell are accessed from opposite directions and thus, the length of the current path through every cell is generally constant. The result is constant resistance for the current path associated with each memory cell.

Furthermore, since each cell bit line is accessed by only one select transistor, each memory cell is symmetrically accessed.

To access a single bit memory cell, the following must be activated: its word line WL, the two select lines associated with the select transistors which are connected to the cell bit lines of the memory cell, and the metal lines connected to the contacts associated with the activated select transistors. For example, cell Q is accessed by activating word line WLB, select lines SEL 2L and SEL 3U which activate select transistor 2L connected to contact $E_i'$ and select transistor 3U connected to contact $O_i'$, respectively, and metal lines $ME_i$ and $MO_i$ (which provide power to contacts $E_i'$ and $O_i'$, respectively)

The following table lists the cell bit lines that must receive power in order to access each cell P, Q, R and S of FIG. 2. It also lists the metal lines and select transistors needed to provide power to the Listed cell bit lines. The select transistors are activated by activating the lines associated with them. Since the memory cells P, Q, R and S are on a single word line WLB, the word line is not listed though it must also be activated.

TABLE 1

| Cell | Drain Metal Line | Source Metal line | Drain Select Transistor | Source Select Transistor |
|---|---|---|---|---|
| P | $MO_i$ | $ME_i$ | 1U | 2L |
| Q | $ME_i$ | $MO_i$ | 2L | 3U |
| R | $MO_i$ | $ME_i$ | 3U | 4L |
| S | $ME_i$ | $MO_{i+1}$ | 4L | 1U |

It is noted that cells P, Q, R and S define the four different types of cells. Each of these cells is accessed by the two metal lines providing power to their bit lines and by the two upper and two lower select lines which surround their bit lines.

For most memory cells, the metal line associated with the left cell bit line will receive the source voltage for reading, programming, (if the cell is programmable) and erasure (if the cell is electrically erasable). For NROM cells which are programmed in the opposite direction from which they are read, the metal line associated with the left cell bit line will receive the source voltage during reading and the drain voltage during programming. The symmetry of the present architecture ensures that the NROM cells will be fully accessible during both reading (forward direction) and programming (backward direction).

Figure 3:
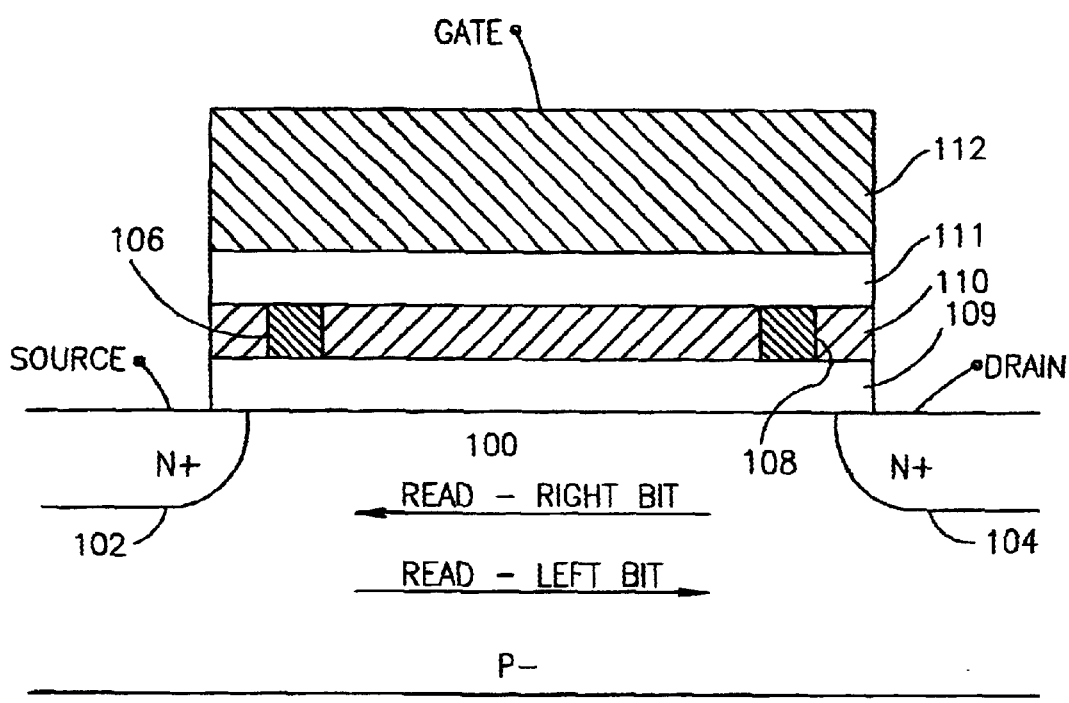
FIG. 3 is a schematic illustration of a prior art, dual bit cell.

The architecture of the present invention can also be utilized for dual bit cells of the type which have one bit on either side of the cell. Such a dual bit cell is described in Applicant's copending U.S. patent application Ser. No. 08/905,286, filed Aug. 1, 1997 entitled "Two Bit Non-Volatile Electrically Erasable and Programmable Semiconductor Memory Cell Utilizing Asymmetrical Charge Trapping" and assigned to Saifun Semiconductors, the same assignee as for this application. FIG. 3, to which reference is now made, schematically illustrates the dual bit cell of U.S. patent application Ser. No. 08/905,286, filed Aug. 1, 1997. The cell has a single channel 100 between two bit lines 102 and 104 but has two separated and separately chargeable areas 106 and 108. Each area defines one bit. For the dual bit cell of FIG. 3, the separately chargeable areas 106 and 108 are found within a nitride layer 110 formed in an oxide-nitride-oxide sandwich (layers 109, 110 and 111) underneath a polysilicon layer 112.

To read the first bit, stored in area 106, bit line 104 is the drain and bit line 102 is the source. The cell is designed to ensure that, in this situation, only the charge in area 106 will affect the current in channel 100. To read the second bit, stored in area 108, the cell is read in the opposite direction. Thus, bit line 102 is the drain and bit line 104 is the source.

The truth table for reading the bits of cells P, Q, R and S, assuming the cells are dual bit cells, is presented hereinbelow in Table 2. Typical voltages might be: 2.7–3V on the word line WL (not listed in Table 2), 1.6–2V on the drain metal line, 0V on the source metal line and the standard chip voltage Vcc on the select lines. The subscript 1 refers to the left bit 106 and the subscript 2 refers to the right bit 108 in the cell of FIG. 3.

TABLE 2

| Cell | Drain Metal Line | Source Metal Line | Select Lines |
|---|---|---|---|
| P1 | $MO_i$ | $ME_i$ | 1U, 2L |
| P2 | $ME_i$ | $MO_i$ | 2L, 1U |
| Q1 | $ME_i$ | $MO_i$ | 2U, 3L |
| Q2 | $MO_i$ | $ME_i$ | 3L, 2U |
| R1 | $MO_i$ | $ME_i$ | 3U, 4L |
| R2 | $ME_i$ | $MO_i$ | 4L, 3U |
| S1 | $ME_i$ | $MO_{i+1}$ | 4L, 1U |
| S2 | $MO_{i+1}$ | $ME_i$ | 1U, 4L |

The dual bit NROM cell described in Applicant's copending U.S. application Ser. No. 08/905,286, filed Aug. 1, 1997 stores two bits, as in FIG. 3. However, the dual bit NROM cells are programmed in the opposite direction from which it is read. Thus, if the first bit is read in one direction, it is programmed in the opposite direction.

The truth table for programming the bits of cells P, Q, R and S, assuming the cells are dual bit NROM cells, is presented hereinbelow in Table 3. Typical voltages right be: 6–10V on the word line WL (not listed in Table 3), 5.5–6.5V on the drain metal line, 0V on the source metal line and 10V on the select lines.

TABLE 3

| Cell | Drain Metal Line | Source Metal Line | Select Lines |
|---|---|---|---|
| P1 | $ME_i$ | $MO_i$ | 2L, 1U |
| P2 | $MO_i$ | $ME_i$ | 1U, 2L |
| Q1 | $MO_i$ | $ME_i$ | 3L, 2U |
| Q2 | $ME_i$ | $MO_i$ | 2U, 3L |
| R1 | $ME_i$ | $MO_i$ | 4L, 3U |
| R2 | $MO_i$ | $ME_i$ | 3U, 4L |
| S1 | $MO_{i+1}$ | $ME_i$ | 1U, 4L |
| S2 | $ME_i$ | $MO_{i+1}$ | 4L, 1U |

For erasing the data in NROM cells, the word lines of interest (one block or one or more blocks of word lines or the entire array of word lines) must be selected. In addition, for any set of word lines, all of the cell bit lines of the array must be selected while only the four select lines surrounding each block of word lines of interest must be selected. Typically, the word lines receive 0V or −5 to −8V, the bit lines receive 5.5 to 6.5V and the select lines receive 10V.

Figure 4A:
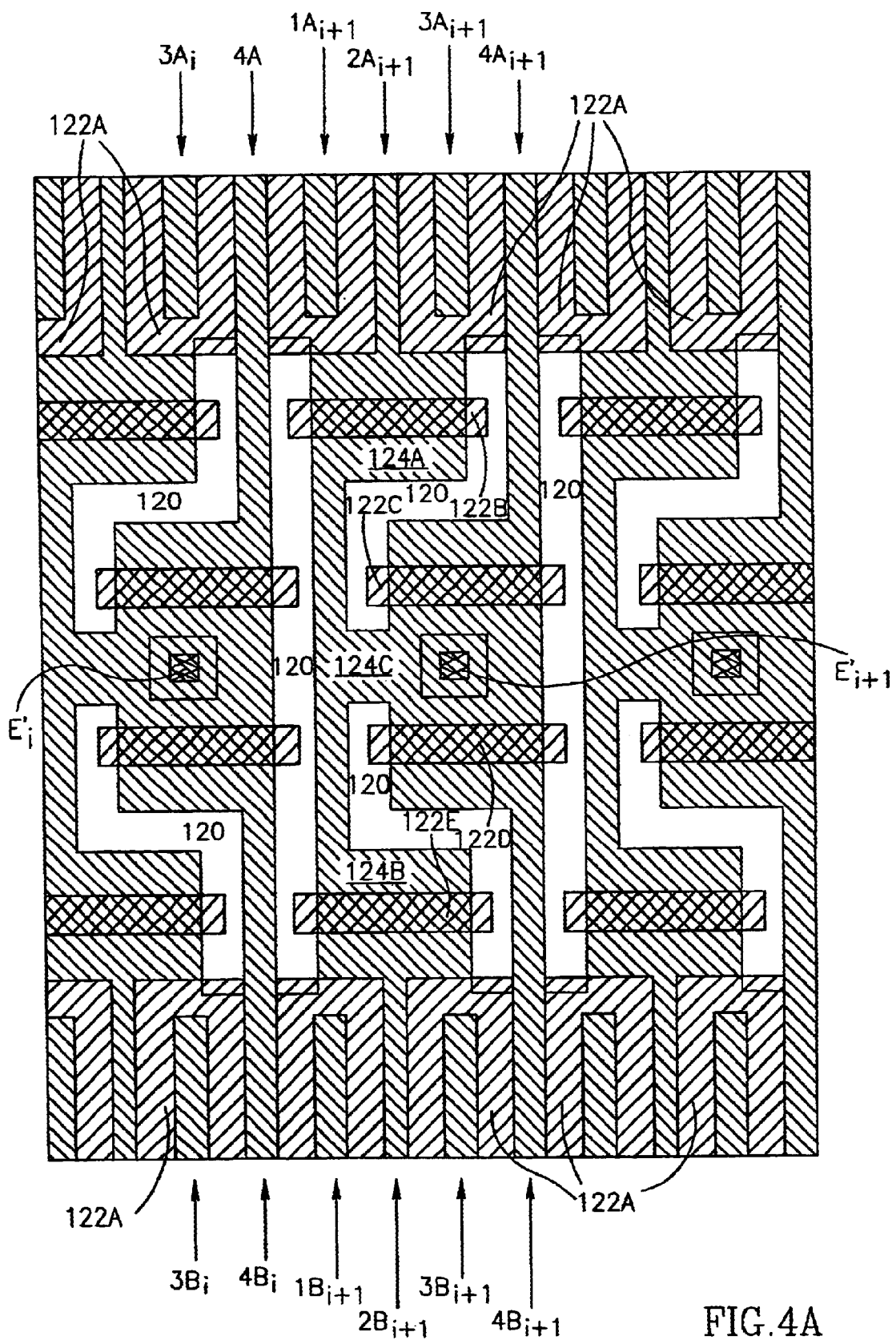
FIGS. 4A, 4B, 4C and 4D are illustrations are of one exemplary layout of the architecture of FIG., 2.
Figure 4B:
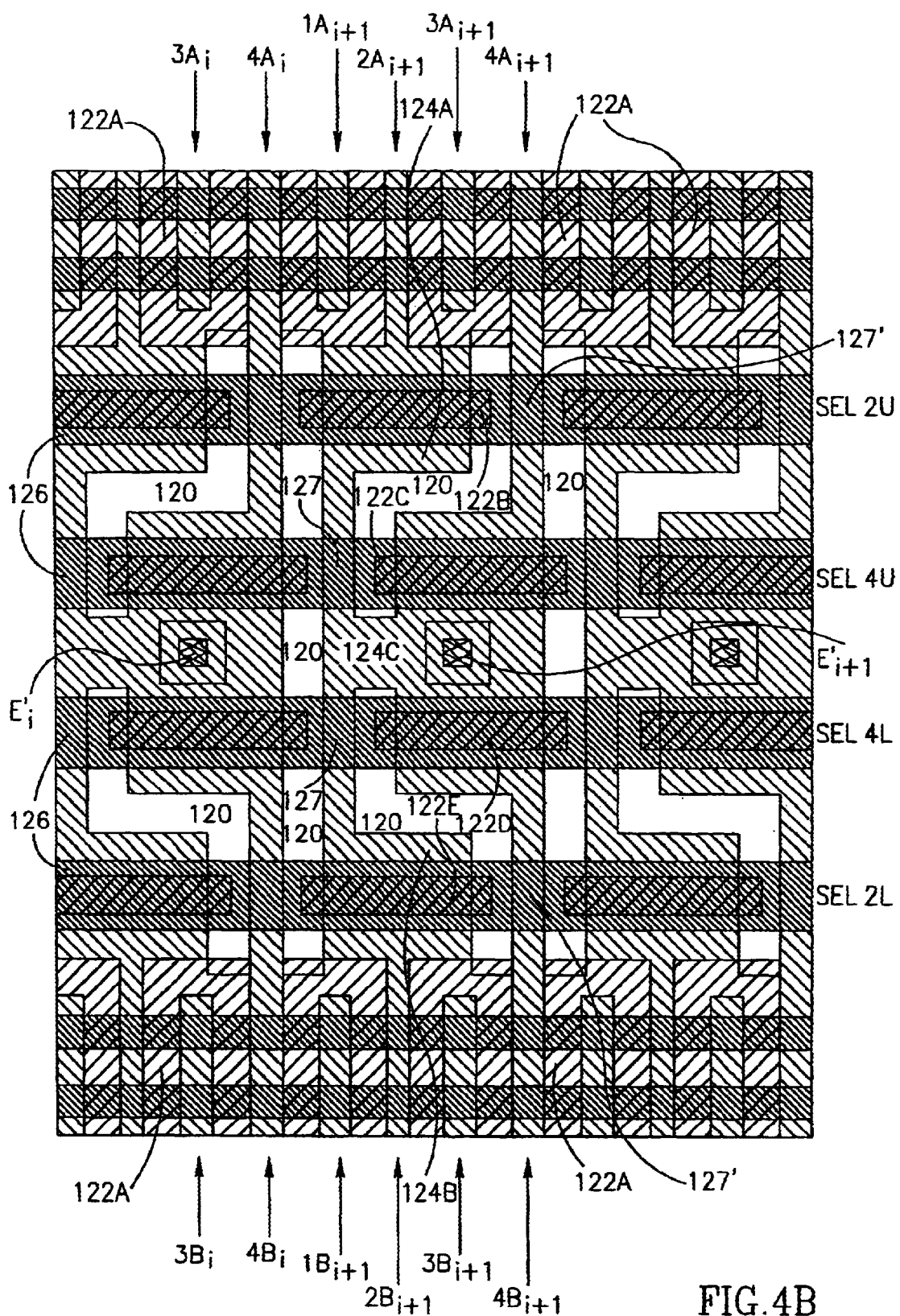
Figure 4C:
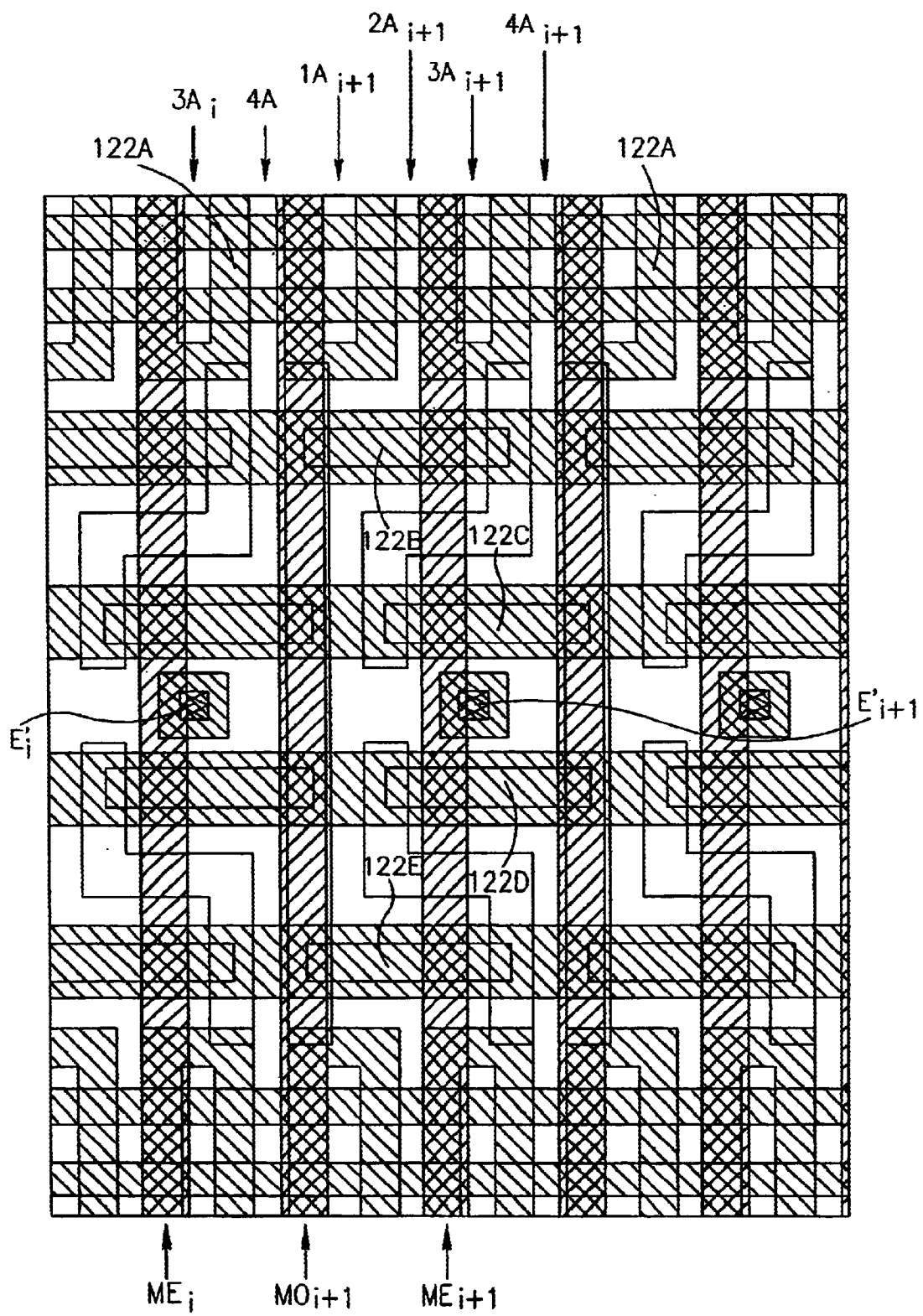
Figure 4D:
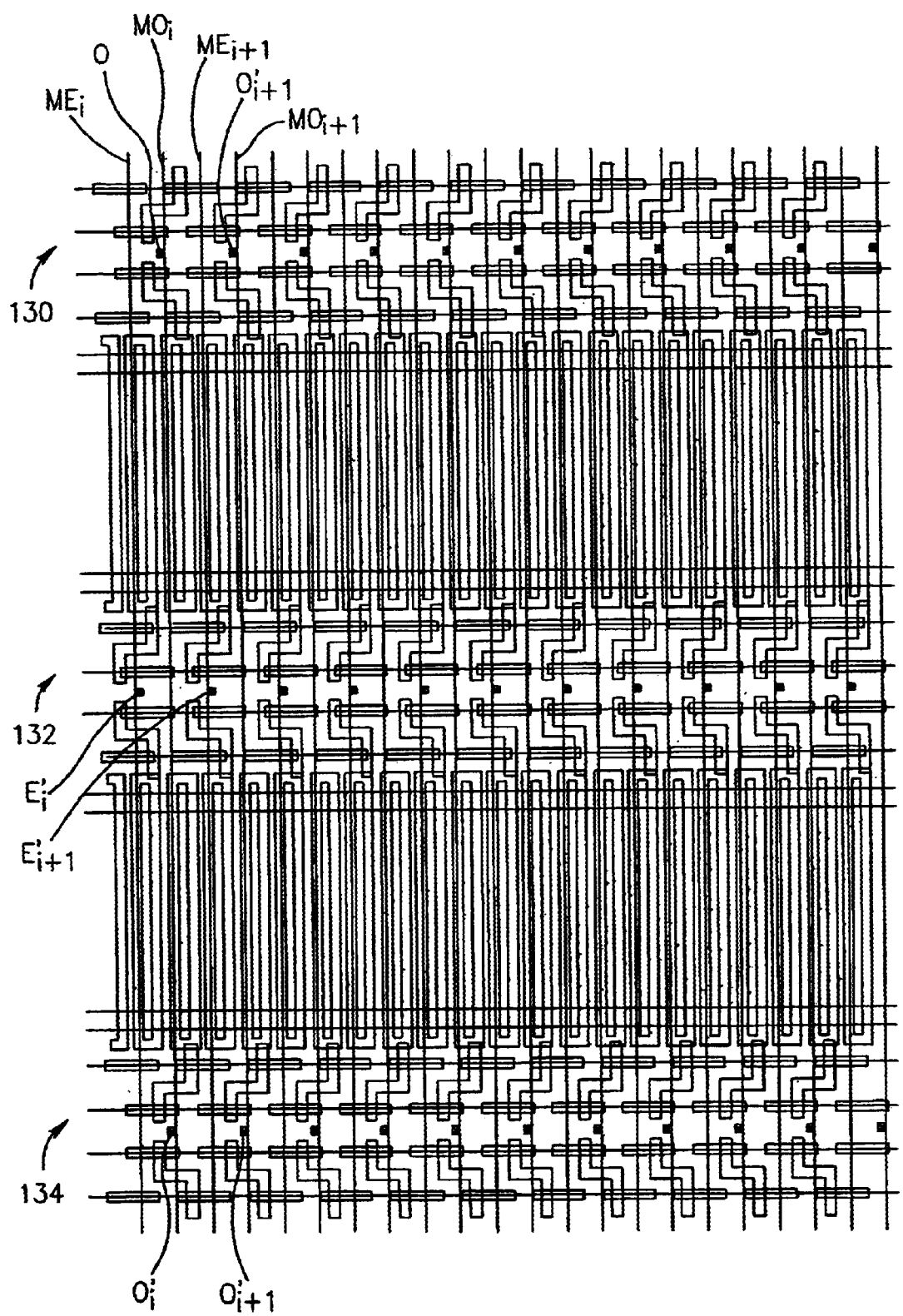

Reference is now made to FIGS. 4A, 4B, 4C and 4D which provide an exemplary layout for the architecture of FIG. 2. FIG. 4A shows, in expanded view, the isolation and bit line layers for the area around and including one section of select transistors, FIG. 4B shows the same area with the addition of the select lines, FIG. 4C shows the same area with the metal layer and FIG. 4D shows two blocks of the array and three select a transistor sections, with the metal lines.

The manufacturing process which utilizes the layout shown herein can be any suitable manufacturing process. For example, it can be the process described in U.S. Pat. No. 5,966,603, assigned to Saifun Semiconductors, the same assignee as this application, whose disclosure is incorporated herein by reference.

The isolation layer 120, shown in white, is typically a field oxide layer grown in the initial stages of manufacturing and provides isolation between neighboring select transistors.

After the isolation layer 120 is produced, a bit line mask 122 is laid down and a bit line implant is performed, producing bit lines wherever there is neither bit line mask 122 nor isolation 120. As can be seen, at the edge of the select area (and marking the edge of the cell area), the bit line mask 122 has a plurality of U shapes (these are marked with reference numerals 122A). The cell bit lines extend within and between the U shapes. FIG. 4A marks columns $3A_i$, $4A_i$ and $1A_{i+1}$ to $4A_{i+1}$ above the select area and columns $3B_i$, $4B_i$, and $1B_{i+1}$ to $4B_{i+1}$ below the select area. It is noted that the even columns extend into the select area (the odd columns extend into the neighboring select areas above and below the select area shown in FIG. 4A).

The bit line mask 122 also has horizontal select transistor markers, labeled 122B, 122C, 122D and 122E. These markers define the channels of the four select transistors. As can be seen, column $2A_{i+1}$ extends to transistor marker 122B, column $4A_{i+1}$ extends to transistor marker 122C, column $4B_{i+1}$ extends to transistor marker 122D, and column $2B_{i+1}$ extends to transistor marker 122E. These columns form the sources for the four select transistors 2U, 4U, 4L and 2L, respectively.

The remaining bit line area (labeled 124 and formed into an E shape) is the contact bit line and it forms the drains for the four select transistors, as follows: the upper bar of the E, labeled 124A, forms the drain of the 2U transistor (opposite column $2A_{i+1}$), the lower bar of the E, labeled 124B, forms the drain of the 2L transistor (opposite column $2B_{i+1}$), and the middle bar of the E, labeled 124C, forms the drains of the 4U and 4L transistors (opposite columns $4A_{i+1}$ and $4B_{i+1}$, respectively). As can be seen, the contact $E_{i+1}'$ is formed within middle bar 124C, FIG. 4A also shows contact $E_i'$.

As shown in FIG. 4B, the select lines are formed from a layer of polysilicon into rows over the channels 122B–122E of the select transistors. FIG. 4B shows the select lines themselves, labeled 126, rather than the mask which forms them. Each select line controls only one type of select transistor.

As can be seen, the vertical line of the contact bit line 124 forms a "feedthrough", labeled 127 in FIG. 4B, below the select lines to connect the various drains. Furthermore, the contact bit line 124 and the select transistors reside within the pitch of four cell bit lines (columns 1, 2, 3 and 4 of group i+1). The contact $E_{i+1}'$ is aligned with column 3 although the feedthrough of contact bit line 124 is not. The elements labeled 127' are feedthroughs of the cell bit lines under the select lines.

FIG. 4C is similar to FIG. 4B but also shows the metal lines of which only metal lines $ME_i$, $MO_{i+1}$ and $ME_{i+1}$ are labeled. Only metal lines $ME_i$ and $ME_{i+1}$ are connected to their respective contacts $E_i'$ and $E_{i+1}'$. The other metal line $MO_{i+1}$ continues through to the neighboring select areas (as can be seen in FIG. 4D). FIG. 4D labels six contacts, $O_i'$ and $O_{i+1}'$ in the first select area 130, $E_i'$ and $E_{i+1}'$ in the second select area 132 and $O_i'$ and $O_{i+1}'$ in the third select area 134.

It is noted that select areas 130 and 134 are slightly different than select area 132 (which is shown in FIGS. 4A, 4B and 4C) since they connect to different contacts. However, the principles discussed herein are the same for all select areas.

Figure 5:
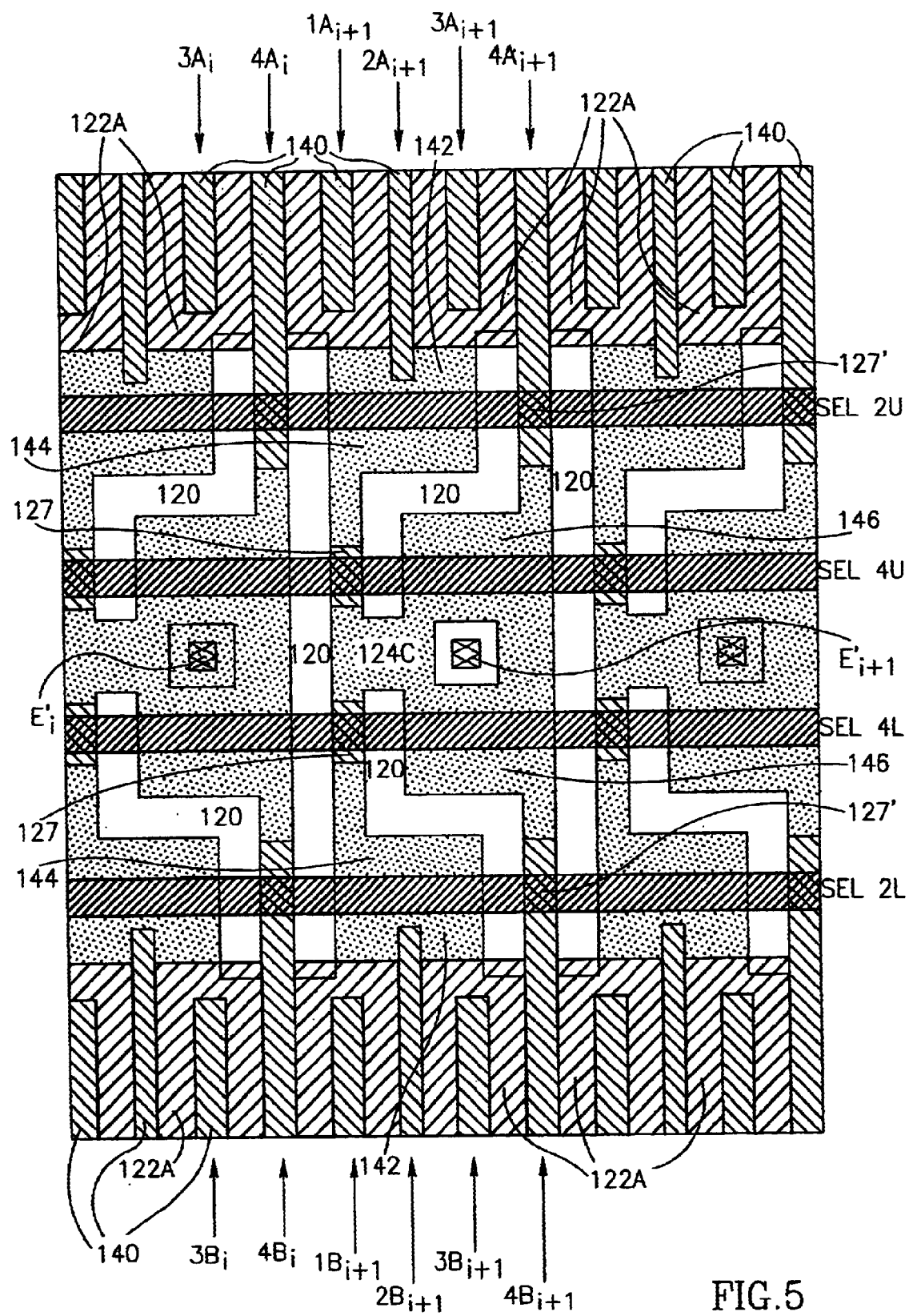
FIG. 5 is an illustration of an alternative layout of the architecture of FIG. 2.

FIG. 5, to which reference is now briefly made, has a similar layout to that of FIGS. 4A, 4B and 4C except tat the bit lines are formed with two implants.

The first implant, marked in FIG. 5 with hatching, is provided in the cell areas to create straight portions 140 of the bit lines and, in the select areas, only in the areas of feedthroughs 127 and 127'. The remainder of the select areas are masked over. In FIG. 5, feedthroughs 127 connect the parts of contact bit line $E_i$ and feedthroughs 127' connect the parts of column 4 of each group. For odd contact bit lines $O_i$, the feedthroughs connect the parts of the odd contact bit lines and the parts of columns 3 of each group.

The first mask is not shown in full in FIG. 5; instead, the U shapes 122A are shown but, for clarity only, the shape of the mask within the select areas is not shown.

After the bit lines and feedthroughs are implanted, the gate oxide for CMOS peripheral devices and for the select devices is grown using thermal oxidation. Following the oxidation, the select lines SEL are deposited in the select areas after which a second, n+ implant is implanted in the select areas only. This second implant is noted in FIG. 5 with dots. It is noted that the second implant very slightly overlaps the cell area to ensure contact between the cell bit lines and the contact bit lines.

Because the second implant is performed after the select lines SEL are deposited, the second implant is self-aligned to the select lines. Furthermore, since the first implant was only in the areas of the feedthroughs 127 and 127', most of the areas under the select lines have no n+ implant and thus, the select lines define the channels of the select transistors. This is not true for the areas of the feedthroughs 127 and 127' which provide electrical feedthrough under the select lines SEL.

The combination of the first and second implants produces the cell and contact bit lines. For example, the straight portions 140 of columns $2A_{i+1}$ and $2B_{i+1}$, produced by the first implant, electrically connect with "T" portions, labeled 142, of the second implant which is on one side of select lines SEL 2U and 2L, respectively. On the other side of select lines SEL 2U and 2L are portions 144 which, via feedthroughs 127, are electrically connected to the central portion 124C of contact bit line $E_{i-1}$.

Similarly, the straight portion 140 of columns 4Ai+1 and 4Bi+1, produced by the first implant, extend electrically under the select lines SEL 2U and SEL 2L, respectively, due to feedthroughs 127', where they electrically connect with "L" portions 146 of the second implant. On the other side of select lines SEA 4U and 4L is the central portion 124C of contact bit line $E_{i+1}$.

As shown in FIG. 5, the contact bit line (marked with dots) has the same shape as before since it is located in the portion of the select areas not covered with field isolations 120. However, the channels of the select transistors are now defied by the width and location of the select lines SEL rather than by a bit line mask as in the previous embodiment, This enables the channels to be simmer and in the previous embodiment and it provides self-alignment to the select transistors.

Figure 6:
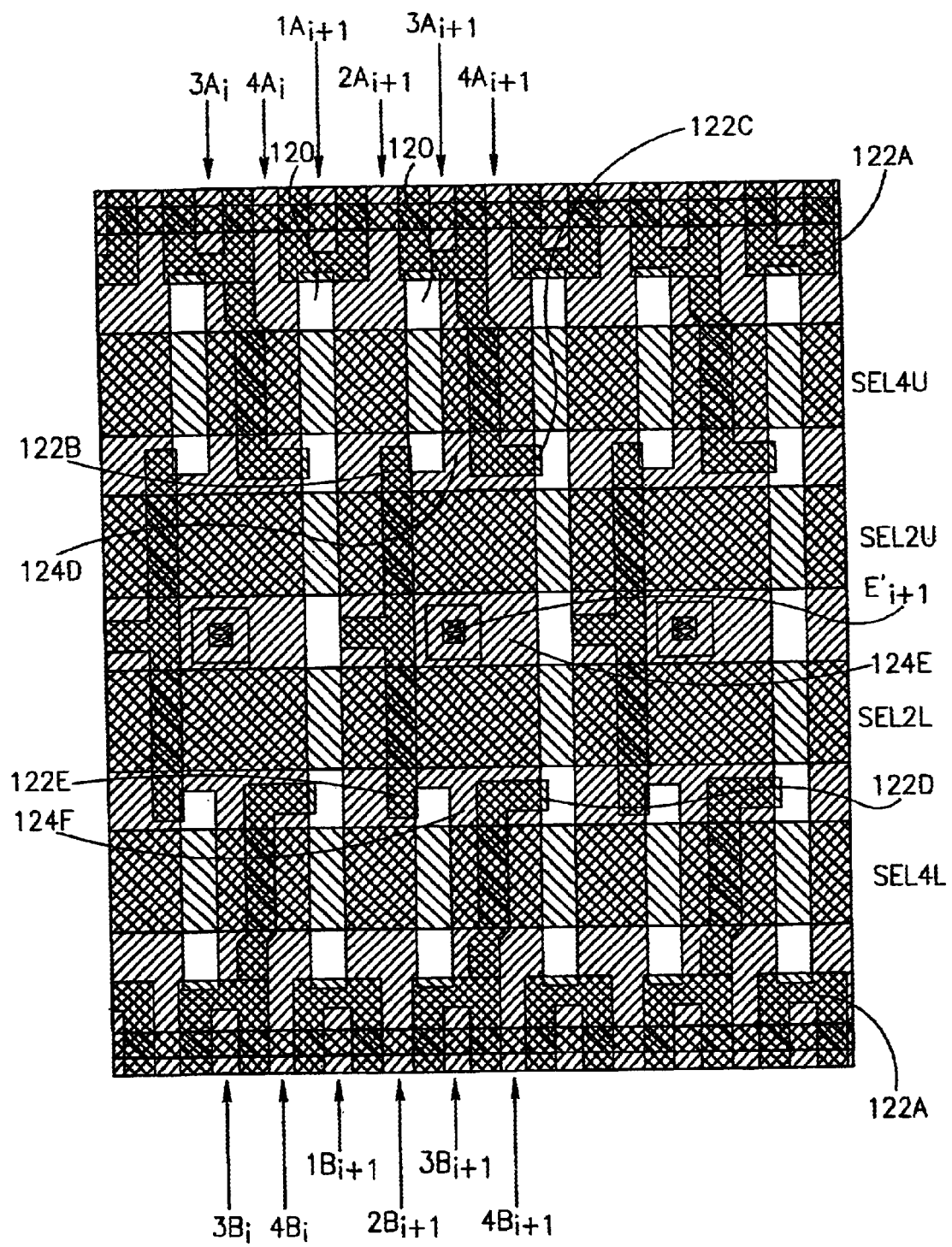
FIG. 6 is an illustration of a further alternative layout of the architecture of FIG. 2.

FIG. 6, to which reference is now briefly made, shows an alternative layout for the select areas. In this embodiment, the select transistor markers 122B–122E are vertical. The bit and select lines are changed accordingly. Sections 124D, 124E and 124F form one Continuous contact bit line 124.

It will be appreciated that any layout which produces an architecture with the same connections as those of FIG. 2 is incorporated within the present invention and that the layouts of FIGS. 4, 5 and 6 are exemplary only.

Figure 7:
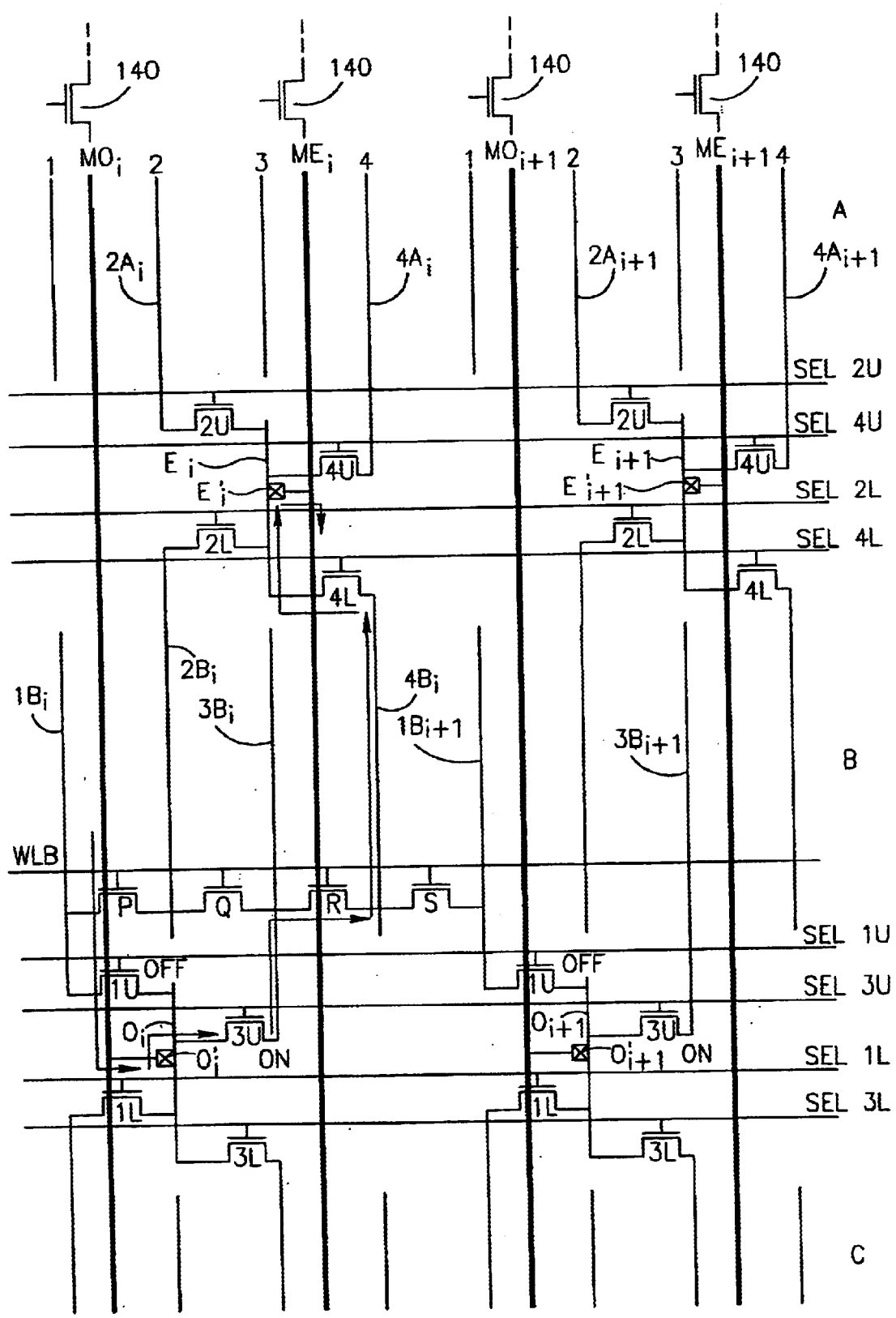
FIG. 7 is a schematic circuit diagram illustration showing the flow of current when accessing a particular memory cell.

Reference is made to FIG. 7, which illustrates an exemplary current path through one of the cells in the array of the present invention during programming. As can be seen, to program the cell R, the current flows from a power supply, through a series of transistors in a column multiplexer (YMUX) (of which only the last transistor 140 is shown) into the metal bit line MOI. From there, the current flows through contact $O_i'$ and select transistor 3U and into diffusion bit line $3B_i$. From there it passes through cell R to diffusion bit line 4BI, after which the current passes through select transistor 4L and contact $E_i'$ to metal bit line $ME_i$. A second series of transistors in the YMUX (of which only the first transistor 140 is shown) connects the metal bit line $ME_i$ to ground. During a read operation, the current into the array flows in a similar path.

Since each element of the current path has an inherent resistance, the current flowing into and out of the array causes voltage drops therein. This leads to both a reduced drain voltage and an increased source voltage in the array cell R. Therefore, if a specific drain to source voltage $V_{DS}$ is required for the proper operation of the array cell R, then the higher the total voltage drop along the current path, the larger the external power supply that is required.

Moreover, both in read and in program modes, the array cell R operates in saturation with a controlled gate voltage. Therefore, the higher the source voltage, the lower the current will be. Assuming no change in the gate voltage, this increases both the read access time and the programming time.

Further, while programming an NROM cell, a higher source voltage reduces the endurance of the cell. Thus, it is desirable to minimize the voltage drops along the path into and out of the array.

In order to reduce the voltage drops on the transistors along the access path to the array, the conductance of the transistors can be improved. Increasing the channel widths of the transistors is an obvious way to achieve this goal. However, this causes two undesired consequences:

1. Slower access time. This is due to the increased parasitic capacitance along the access path to the array.
2. Larger die area. Among all the transistors in the access path to the array, the select transistors have the greatest effect on the die size. This is because there is one select transistor SEL per diffusion bit line, per block. The edge transistors 140 in the YMUX path (i.e. the transistors connecting the YMUX to the metal bit lines ME or MO), also significantly affect the die size since there is one such transistor per metal bit line ME or MO. The other transistors in the YMUX path have a relatively small effect on die size since each one controls multiple bit lines and thus, there are fewer of them.

Thus, alternative methods to reduce the resistance of the transistors in the current path without the area and timing penalties mentioned above are preferred.

In one embodiment of the present invention, the select transistors SEL are implemented as low threshold voltage ($V_\tau$) devices. Since a transistor's resistance is proportional to $1/(V_{gs}-V_T)$, where $V_{gs}$ is the gate to source voltage and is fixed, the low $V_\tau$ devices have an inherently lower resistance compared to standard transistors.

However, although the low threshold voltage devices provide the desired lower resistance producing such devices requires additional process steps, which increase the die cost.

In an alternative embodiment of the present invention, the select transistors SEL are produced with a channel length shorter than the minimum allowed design rule for standard transistors, i.e. $L_{SEL}<L_{min}$. The shorter channel length provides the lower resistance devices.

Applicants have realized that, if the virtual ground array is operated as described in Assignee's copending U.S.

patents (U.S. Pat. 6,134,156, issued on Oct. 17, 2000 and entitled "Method For Initiating A Retrieval Procedure In Virtual Ground Arrays" and U.S. Pat. No. 6,128,226, issued on Oct. 3, 2000 and entitled "Method And Apparatus For Operating With a Close To Ground Signal"), the select transistors always operate as "pass transistors", i.e. there is no case in which these transistors turn on or operate with a large $V_{DS}$. Only due to this specific mode of operation, explained with reference to FIGS. 8, 9A and 9B, can the channel length of the select transistors SEL be shortened beyond the minimum allowed design rule for standard transistors.

Figure 8:
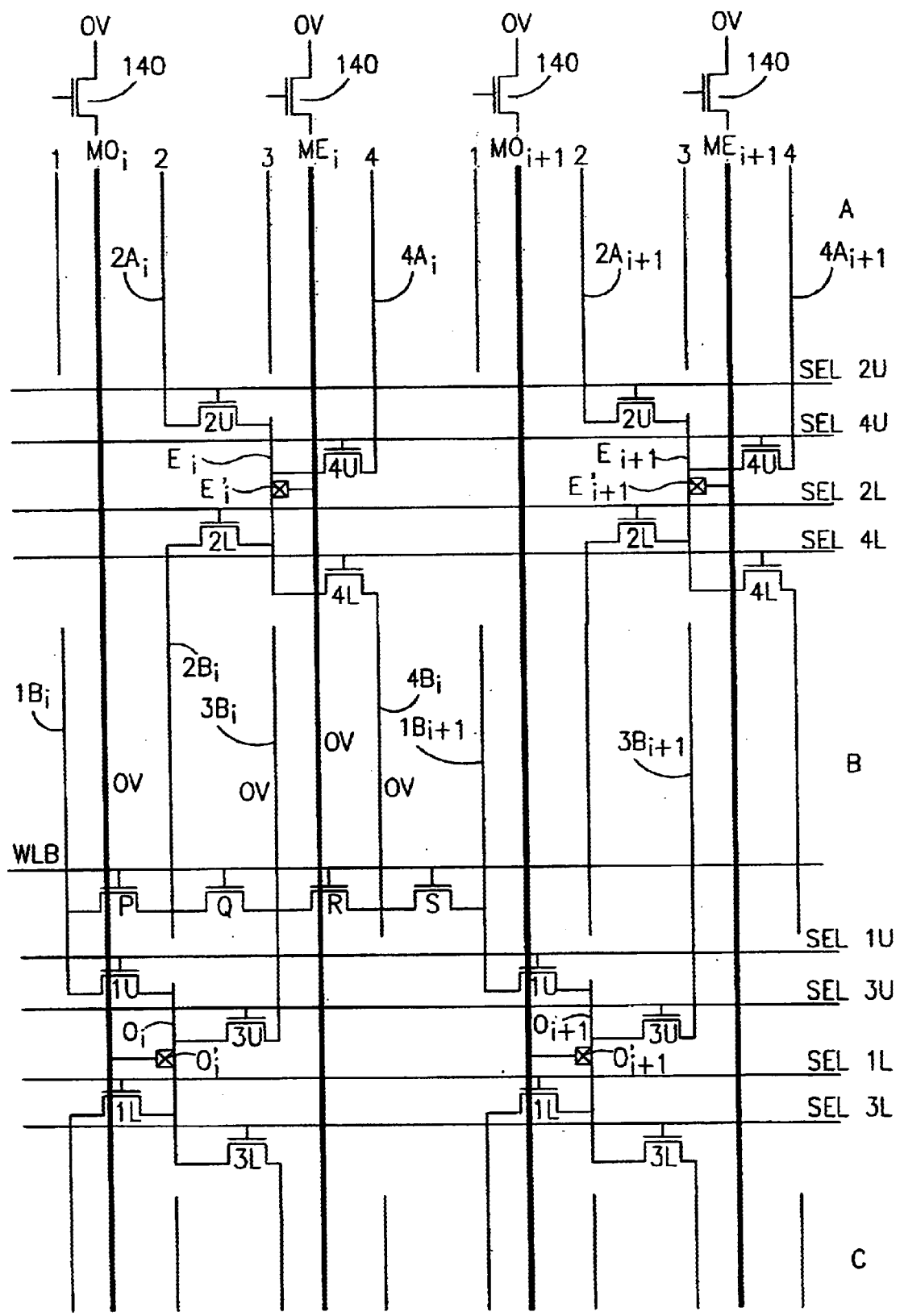
FIG. 8 is a schematic circuit diagram illustration, similar to FIG. 7, showing the voltage levels on the metal bits lines prior to accessing a particular memory cell.

Reference is now made to FIG. 8, which is similar to FIG. 7 but illustrates the initial state of the memory array. Here, the whole array is finally discharged to ground after which, two select transistors SEL (such as SEL 3U and 4L) are selected to access an array cell for a future read or program operation. Thus, the transistors are activated with $V_{DS, SEL}$ at 0V. After the select transistors SEL are activated, power is provided to the metal bit line, such as $MO_i$, associated with the drain of the accessed cell while the metal bit line, such as $ME_i$, associated with the source of the accessed cell is held close to ground. The remaining metal bit lines are allowed to float.

Figure 9A:
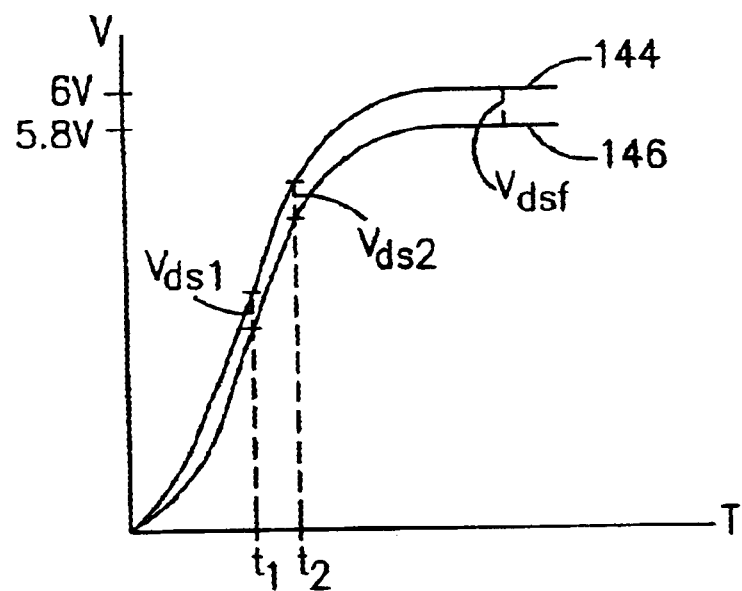
FIGS. 9A and 9B are graphical illustrations of the rise of voltage on a metal bit line and a diffusion bit line for the drain and source, respectively.
Figure 9B:
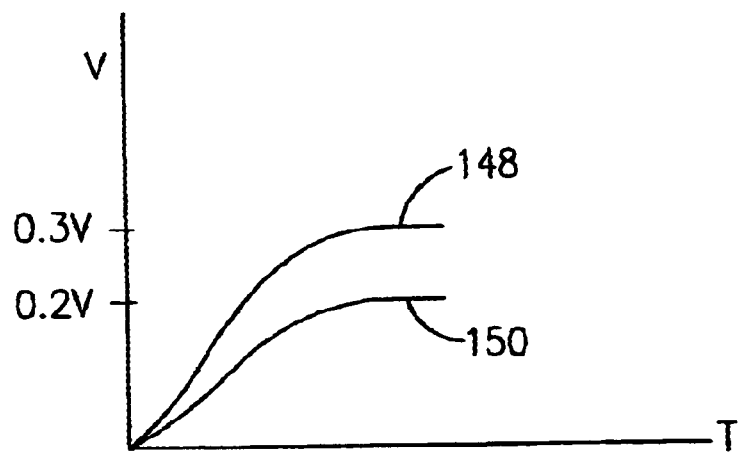

Reference is now made to FIGS. 9A and 9B, which illustrate the voltage level during accessing of a cell on the selected metal and diffusion bit lines connected to the drain (curves 144 and 146, respectively) and to the source (curves 150 and 148, respectively) of the cell. Once the metal bit lines, $MO_i$ and $ME_i$ in this example, have been selected, power is provided to them (depending on the operation to be performed). For example, assume $MO_i$ is driven high to about 6V for programming (curve 144) and $ME_i$ is driven to ground or about 200 mV (curve 150). The voltage on the metal bit line $MO_i$ rises from ground level, as indicated by curve 144.

Since the select transistor SEL 3U is already turned on, the diffusion bit line $3B_i$ tracks the rise of $MO_i$. This is shown in curve 146. Thus, as can be seen in FIG. 9A, at any given time, the voltage drop $V_{ds}$ across the select transistor SEL 3U is small. Two times, $t_1$ and $t_2$, are shown and it can be seen that the voltage drops $V_{ds1}$ and $V_{ds2}$ at those times are small (on the order of 0.2V). On the other side of the memory cell R, as shown in FIG. 9B, a similar situation occurs as soon as the memory cell R starts conducting current (in general, word line WLB is high before the metal bit line is driven high). However, here the diffusion bit line $4B_i$ will be the first to rise (curve 148) followed by the rise of metal bit line $ME_i$ (curve 150). As in the previous case, the drain to source voltage $V_{DS}$ across select transistor SEL 4L is small (on the order of 0.1V).

In general, select transistors SEL should be able to withstand, on their terminals, the high voltages required at erase and program operations. Thus, they should be high voltage devices. However, in the array of the present invention, since the select transistors SEL always operate as pass transistors, they do not suffer the "snapback effect" which occurs with high drain to source voltage $V_{DS}$ and therefore, their channel length can be shortened beyond the minimum allowed design rule in order to provide a smaller resistance.

How much the select transistors can be shortened depends on the punchthrough and leakage characteristics of the transistors. For example, if array cell R is accessed and diffusion bit line $3Bi$ is driven high, then if, the select transistor SEL 2L leaks, an additional path from metal bit line $MO_i$ to metal bit line $ME_i$ may be present (from diffusion bit line $3B_i$, through cell Q, through diffusion bit line $2B_i$, and through the leaky select device SEL 2L). Thus, the leakage characteristics of the short SEL devices should be well controlled.

As an example, if the standard minimum channel length of a high voltage device is $L_{min}$=0.8 μm, then a typical channel length of the shorter SEL devices is $L_{SEL}$=0.5 μm.

It should be noted that other transistors in the access path to the array (such as YMUX transistor 140) also act as pass transistors. Thus, in accordance with a preferred embodiment of the present invention, YMUX transistor 140 can also have a short channel length. Alternatively, or in addition, YMUX transistor 140 can have a low threshold voltage in order to reduce its resistance, as described herein above.

Figure 10:
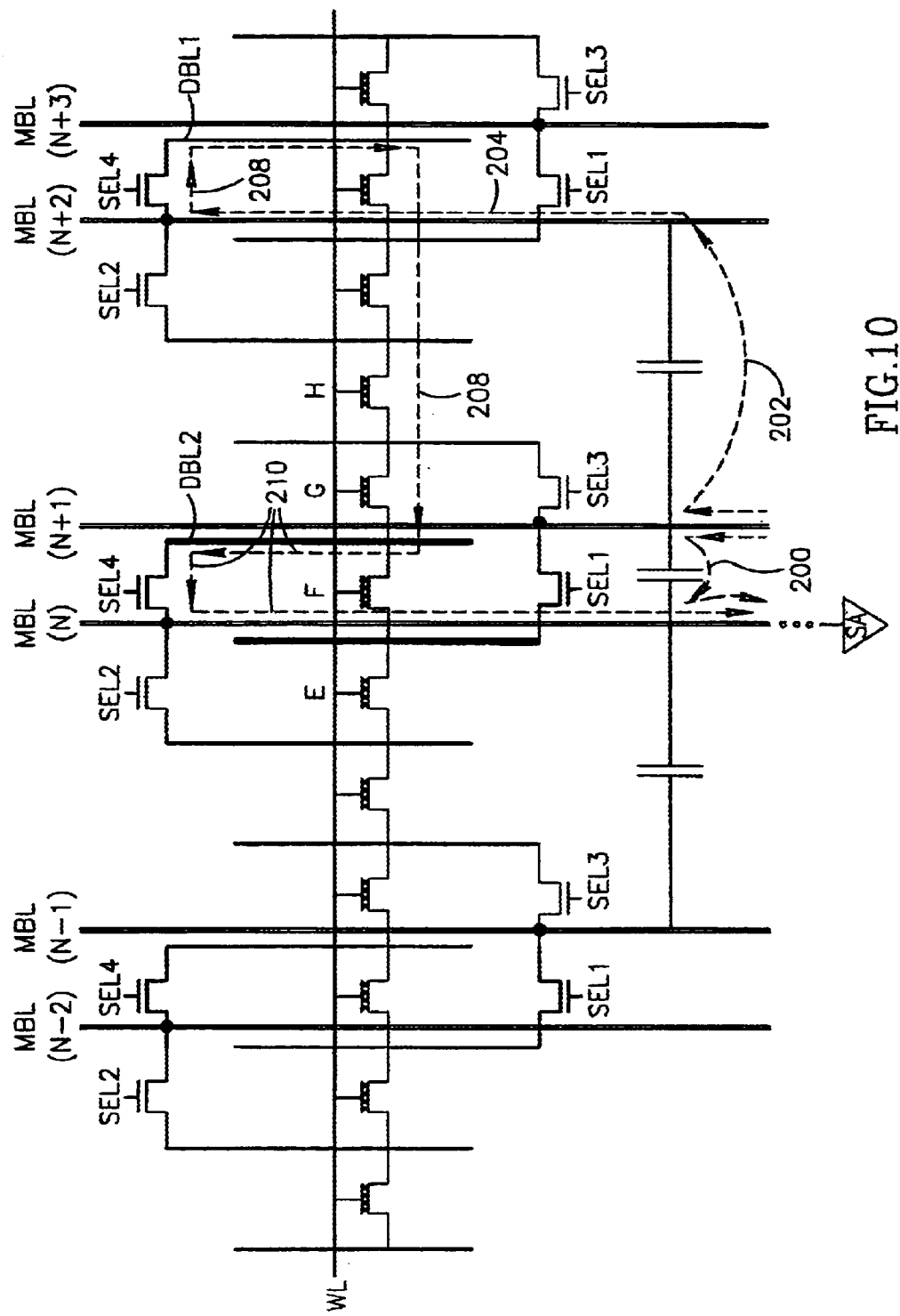
FIG. 10 is a schematic illustration of coupling of voltages between metal bit lines.

In a large array, there is undesired coupling between neighboring metal bit lines ME and MO. This is illustrated in FIG. 10 to which reference is now made. FIG. 10 shows a plurality of metal bit lines MBL (N−2) through MBL (N+3) and one row WL of cells. FIG. 10 also shows select transistors SEL1, SEL2, SEL3 and SEL4. The following discussion assumes a close-to-ground read operation, such as that used for NROM cells and described in U.S. Pat. No. 6,128,226. However, the invention is also applicable for other, non-close-to-ground types of reads and to arrays of other types of memory cells.

In FIG. 10, the right bit of cell F is being accessed for reading. To do so, only select transistors SEL1 and SEL4 are activated. Metal bit line MBL(N+1) drives the drain voltage through its select transistor SEL1 and MBL(N) carries the source signal (i.e, a close to ground voltage) through its select transistor SEL4. SEL2 and SEL3 are turned off.

One type of coupling is direct coupling (shown with arrow 200). The presence of voltage transitions on the drain line MBL(N+1) affects the voltage level of the source line MBL(N). The direct coupling typically adds noise to the signal being read unless sufficient discharge time is added prior to sensing.

Another type of coupling, shown with arrow 202, occurs between the drain line MBL(N+1) and its other neighboring metal bit line MBL(N+2) at is floating. Due to the coupling, floating metal bit line MBL(N+2) will experience a voltage rise as well. Since the floating metal bit line MBL(N+2) is also connected to one of the activated SEL4 type of select transistors, the voltage rise on floating metal bit line MBL (N+2) is passed (arrows 204 and 206) to the diffusion bit line DBL1. Since the word line WL is high, this will cause some current to flow (arrow 208) through the activated chain of cells to the diffusion bit line DBL2. Diffusion bit line DBL2 is connected (arrows 210) to metal bit line MBL(N) through select transistor SEL4. Since metal bit line MBL(N) is acting as a source and is connected to a sense amplifier 212, this extra current will contribute to the read signal being developed.

It will be appreciated that the extent of the effect of the extra current is a function of the conductivity of the cells in the activated chain of cells. It will also be appreciated tat the only cell for which this type of coupling occurs is the cell, such as cell F, to which the current arrives at the diffusion bit line which is connected, via a metal bit line, to sense amplifier 212. Cells E, G and H do not suffer from this type of effect since the diffusion bit line to which the injected noise arrives is not connected to the sense amplifier 212

It will further be appreciated that, in a virtual ground array which reads from the drain bit line (as opposed to the source bit line above), similar coupling effects can be identified.

Given the noise problems, the requirements on the access time are relaxed such that the signal to be read will be significantly larger than the injected noise level or to give enough time, prior to sensing, to suppress transient noise effects. Another solution that solves the coupling effects is to widen the space between metal bit lines, such that their coupling will be lower. However, this is not possible for arrays with such an architecture and/or a small bit line pitch.

Another problem in large arrays with a small metal bit line pitch is that a dense pattern of metal bit lines leads to poor yield mainly due to point defects on the metal lines. This is typically solved by having an extra section of the array for redundancy. Unfortunately, this solution costs in extra area on the chip and usually degrades the access time.

Furthermore, in the array of the previous embodiments, when accessing a row for programming a byte, neighbor cells on the same row are also on and conduct a transient current. This current causes an undesired, slight programming of the neighbors, known to those skilled in the art as "program disturb".

A further issue which arises in long arrays is that their metal bit lines are, correspondingly, long and the longer a metal bit line is, the more resistance it has. Resistance anywhere affects the voltage level on the line such that the voltage arriving at the drain side of an accessed cell is lower than the voltage originally provided to the metal bit line and the voltage at the source side of an accessed cell is higher than than the ground voltage originally provided. Thus, the power supplies must be designed to compensate for these expected voltage changes which usually results in an over-sized power supply.

Figure 11:
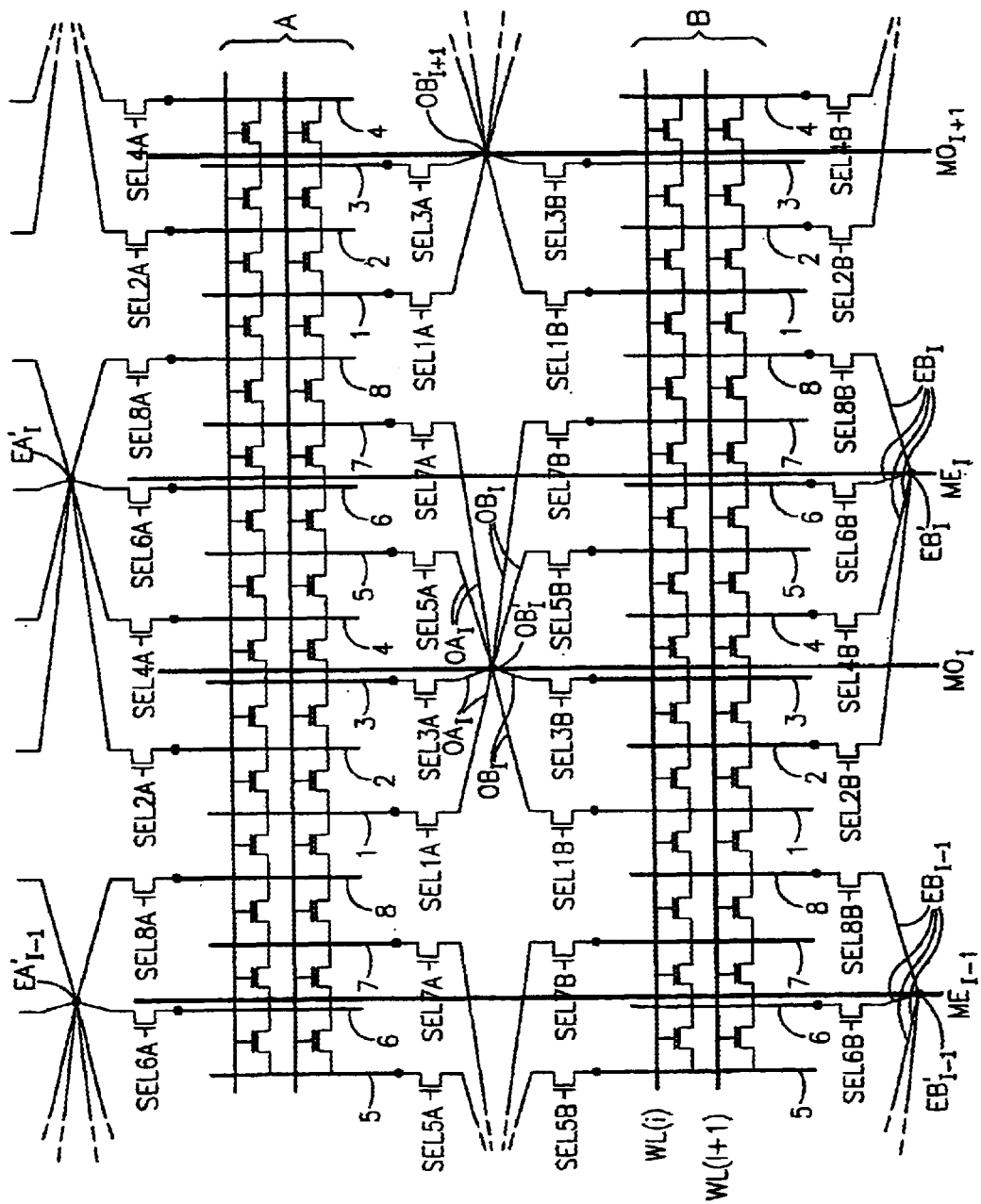
FIG. 11 is a schematic illustration of an alternative embodiment of the architecture of the present invention in which there are two metal bit lines for every eight diffusion lines.

Reference is now made to FIG. 11, which illustrates an alternative architecture which at least reduces the coupling and neighbor problems and improves the yield problem. In this embodiment, there are two metal bit lines for eight diffusion bit lines. The select transistors are numbered according to the diffusion bit line (1–8) they control and to the sector (A, B, C, etc.) that they are a part of.

As in the previous embodiments, there are even and odd metal bit lines $ME_I$ and $MO_I$. However, in this embodiments each metal bit line serves four different diffusion bit lines rather than two of them as in the previous embodiments. For example, each odd metal bit line $MO_I$ provides power to select transistors SEL 1X, 3X, 5X and 7X (and thus, to diffusion bit lines 1, 3, 5 and 7) while each even metal bit line $ME_I$ provides power to select transistors SEL 2X, 4X, 6X and 8X (and from there, to diffusion bit lines 2, 4, 6 and 8). It is noted that, for clarity, FIG. 11 indicates the select lines SEL1X-SEL8X but does not show the lines themselves. It is also noted that 'X' stands for the relevant sector, A, B, etc.

As in the previous embodiments, each metal bit line $ME_I$ and $MO_I$ is connected to its respective contact bit line $EX_I$ and $OX_I$, via a contact $EX_I'$ and $OX_I'$.

Because the two metal bit lines $ME_I$ and $MO_I$ together serve eight types of diffusion bit lines, the metal bit lines are more separated than in the previous embodiments. FIG. 11 shows Cat the even metal lines $ME_I$ are routed near the sixth diffusion line, labeled 6, while the odd metal lines $MO_I$ are routed near the third diffusion line, labeled 3. Other arrangements, such as with every or unevenly spaced metal bit lines, are possible and are incorporated in the present invention.

It will by appreciated that the embodiment of FIG. 11 provides a larger spacing between metal bit lines which reduces coupling therebetween and improves the yield. The larger spacing also permits widening of the metal bit lines which reduces their resistance.

Furthermore, in this embodiment, there are eight cells between metal bit lines of the same type rather than four in the previous embodiments. This longer path reduces program disturbs.

Figure 12:
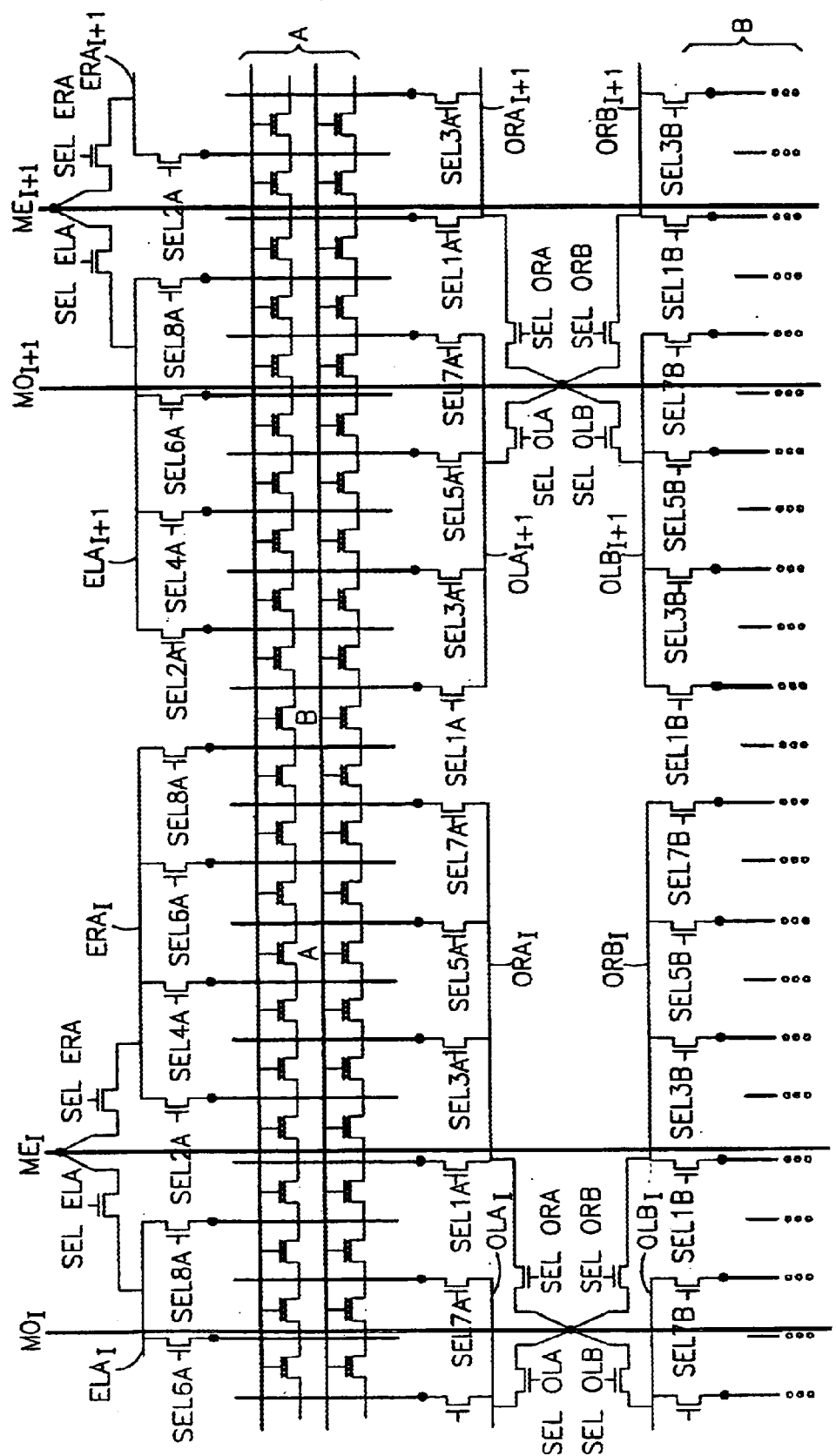
FIG. 12 is a schematic illustration of an alternative embodiment of the architecture of the present invention in which there are two metal bit lines for every sixteen diffusion lines.

Reference is now made to FIG. 12, which illustrates a further embodiment of the present invention in which each two metal bit lines serve 16 different types of diffusion bit lines. Due to the complexity of the architecture, FIG. 12 shows the select transistors of one sector A in full and only some of them for sector B. Furthermore, each sector typically comprises a multiplicity of word lines WL even though, for clarity, only two are shown in FIG. 12.

The structure of this embodiment is similar to that of the previous embodiment, wherein there are eight types of diffusion bit lines, select transistors and select lines. However, in this embodiment, groups of eight diffusion bit lines are connected to a common node $OLX_I$, $ORX_I$, $ELX_I$ or $ERX_I$ and there are segmenting select transistors OLX, ORX, ELX and ERX that connect the common nodes to their respective odd or even metal bit lines MO or ME. The segmenting select transistors are, in turn, controlled by segmenting select lines SEL OLX, SEL ORX, SEL ELX, and SEL ERX, respectively, As can be seen, two segmenting select transistors (one odd and one even) and two select transistors (one odd and one even) must be activated in order to access a cell. Thus, to access cell A, metal lines $ME_I$ and $MO_I$ must receive power, segmenting select transistors ERA and ORA and select transistors 4A and 5A must be activated and the relevant word line must receive power as well. To access cell B, metal lines $ME_I$ and $MO_{I+i}$ must receive power, segmenting select transistors ERA and OLA and select transistors 8A and 1A must be activated and the relevant word line must receive power as well.

It will be appreciated that, due to the segmenting select transistors, each metal bit line is loaded by two segmenting select transistors per sector compared to four select transistors per sector in the embodiment shown in FIG. 11. As a result, when there are many sectors, the total bit line capacitance of the architecture of FIG. 11 is significantly reduced.

It will further be appreciated that the embodiment of FIG. 12 has an even wider spacing between metal bit lines than the previous embodiment, which helps to further reduce the coupling and allows bit line widening to reduce resistance. Program disturbs are also further reduced in this embodiment.

Figure 13:
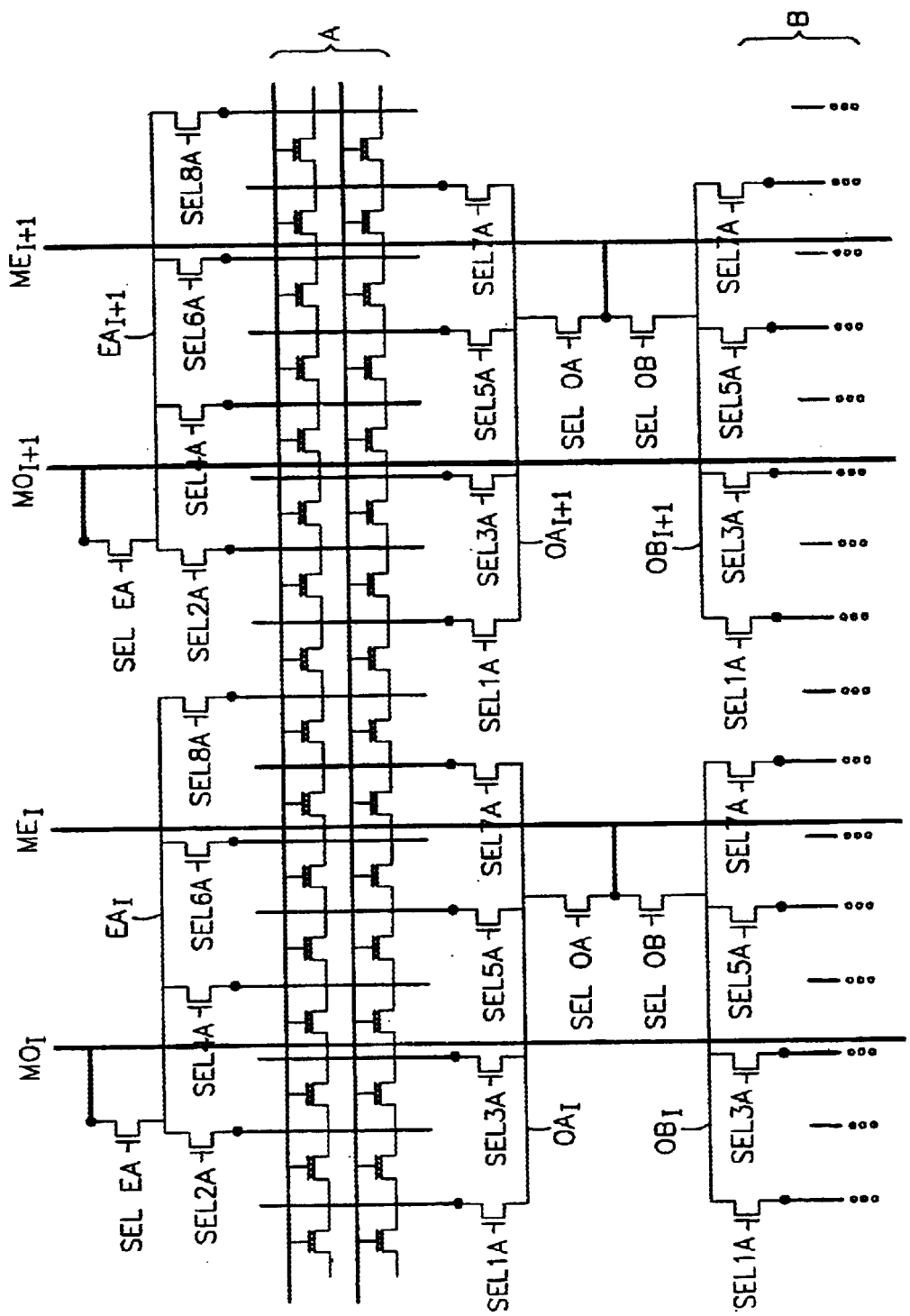
FIG. 13 is a schematic illustration of an alternative embodiment of the architecture of FIG. 12.

The embodiment of FIG. 12 has two select transistors, one SEL OLX and one SEL ORX or one SEL ELX and one SEL ERX per metal bit line per sector. FIG. 13, to which reference is now made, shows an array with only one segmenting select transistor per metal bit line per sector. In this embodiment, there are two metal bit lines per set of eight diffusion bit lines, as it the embodiment of FIG. 9.

In FIG. 13, the ever metal bit lines ME each have one segmenting select transistor EX per sector connected thereto, connecting them to an even common node $EX_I$. The odd metal bit lines have one segmenting select transistor OX per sector connected thereto, connecting them to an odd contact bit line $OX_I$. As in the previous embodiment, which cell is accessed depends on which metal lines, one even and one odd, and which select and segmenting select transistors (also one even and one odd) are also activated.

It will be appreciated that the embodiment of FIG. 13 operates similarly to that of FIG. 11; however, its metal bit line capacitance is significantly reduced to that FIG. 11.

It will be appreciated that the embodiments of FIGS. 11–13 can utilize the short channel select transistors as discussed hereinabove with respect to FIGS. 7–9.

Figure 14:
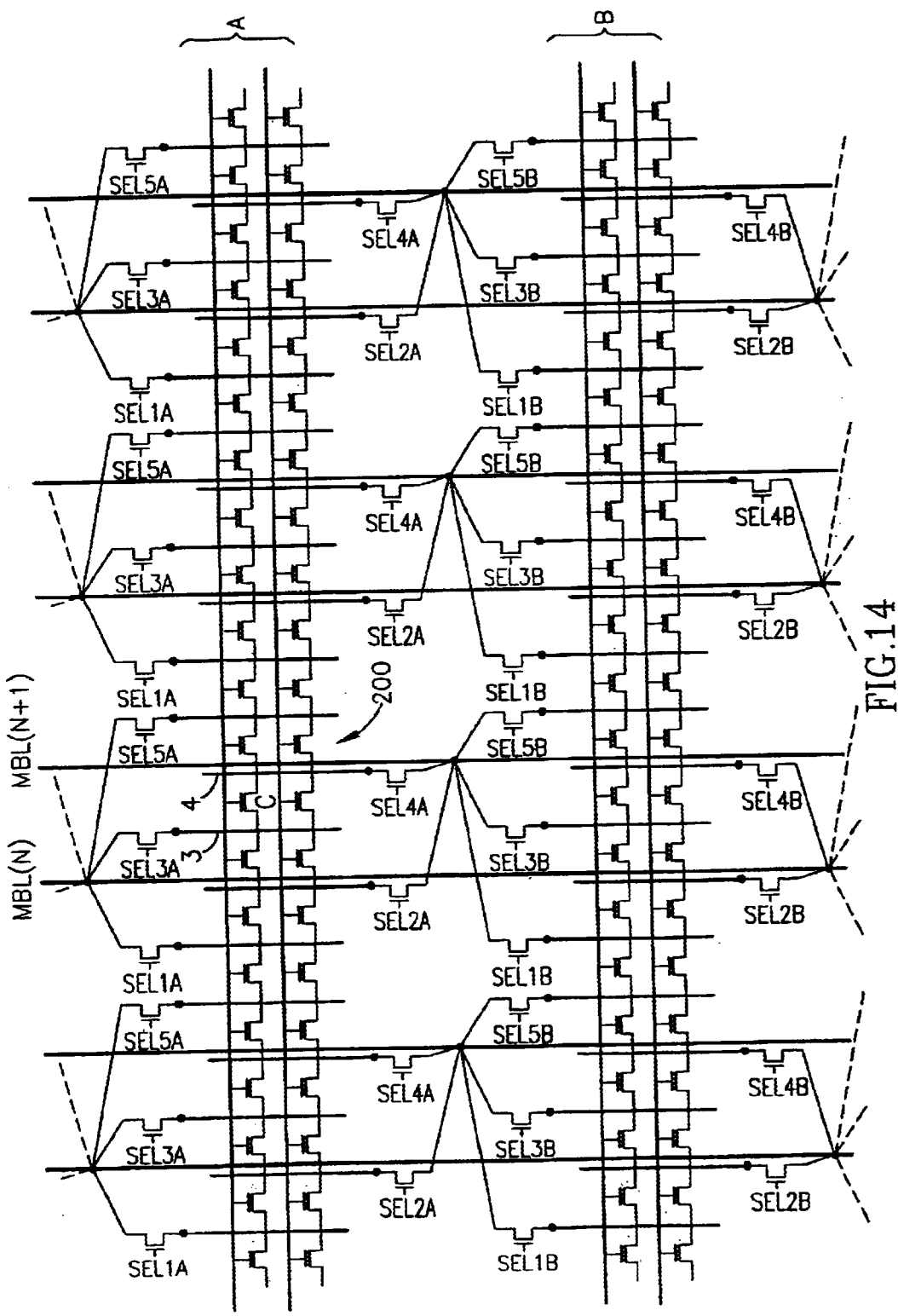
FIG. 14 is a schematic illustration of a further alternative embodiment of the architecture of the present invention.

It will further be appreciated that the number of diffusion bit lines per metal bit line does not have to be a multiple of two, as shown herein. Rather, the principles of the present invention apply to other combinations of diffusion and metal bit lines. This is illustrated in FIG. 14 to which reference is now briefly made. In FIG. 14, there are an odd number (e.g. five) types of diffusion bit lines. In each sector (A, B, C, etc.), the even select transistors SEL 2X and 4X are on one side of the diffusion bit lines (shown below the sector in FIG. 14) while the odd select transistors SEL 1X, 3X and 5X are on the other side of the diffusion bit lines (shown above the sector in FIG. 14).

Furthermore, in this embodiment, the metal bit lines MBL(N) are not organized as even and odd metal bit lines. Instead, each metal bit line MBL(N) has five select transistors SEL 1X-SEL5X connected thereto, where the even select transistors SEL 2X and 4X belong to one sector, such as sector A, and the odd select transistors SEL1X, 3X and 5X belong to a neighboring sector, such as sector B. Nonetheless, each diffusion bit line is activated by too metal bit lines. Thus, for cell C, metal bit line MBL(N) provides power, through select transistor 3A, to diffusion 3, while metal bit line MBL(N+1) provides power, through select transistor 4A, to diffusion 4.

It will be appreciated that other architectures of an odd number of diffusion bit lines and their corresponding select transistors and metal bit lines are possible and are incorporated in the present invention. Furthermore, it will be appreciated that segmenting select transistors can be included in such architectures. Still further, the present invention is applicable to all types of architectures, including but not limited to sliced arrays.

The methods and apparatus disclosed herein have been described without reference to specific hardware or software. Rather, the methods and apparatus have been described in a manner sufficient to enable persons of ordinary skill in the art to readily adapt commercially available hardware and software as may be needed to reduce any of the embodies of the present invention to practice without undue experimentation and using conventional techniques. It will be appreciated by persons skilled in the art that the present invention is not limited by what has been particularly shown and described herein above. Rather the scope of the invention is defined by the claims that follow:

What is claimed is:

1. A virtual ground array comprising:
   memory elements;
   select transistors;
   select lines connected with the select transistors;
   word lines;
   global bit lines; and
   local bit lines connecting the select transistors with the memory elements,
   wherein each of the memory elements has a source and a drain, the virtual ground array is operative to select a set of memory elements and to fix the drains of the set of memory elements to a predetermined potential, the word lines and at least two of the select transistors select the set of memory elements and the global bit lines connect the select transistors to source and drain power supplies.

2. The array according to claim 1 wherein:
   the memory elements disposed along each word line are arranged in series along the word line; and
   the virtual ground array is arranged such that a first set of pairs of select transistors are connected with a first set of pairs of memory elements, and a second set of pairs of select transistors are connected with a second set of pairs of memory elements, and the first set of pairs of memory elements partially overlap each other.

3. The array according to claim 1 and wherein said global bit lines are metal bit lines and said local bit lines are diffusion bit lines.

4. A virtual ground array comprising:
   select transistors selectable by select lines;
   memory elements having a source and a drain, the memory elements selectable by word lines and at least two of the select transistors and arranged in series along the word lines,
   local bit lines connecting the select transistors with the memory elements; and
   global bit lines connecting the select transistors to source and drain power supplies and arranged such that sets of memory elements are selected in pairs along each word line by two partially overlapping pairs of select transistors,
   wherein the pairs of select transistors and associated global and local bit lines are operative to set the drain of the selected memory elements to a set potential.

* * * * *